US012672527B2

(12) United States Patent
Fu et al.

(10) Patent No.: US 12,672,527 B2
(45) Date of Patent: Jun. 30, 2026

(54) SEMICONDUCTOR DEVICE INCLUDING A SELF-FORMED BARRIER METAL LAYER

(71) Applicant: TAIWAN SEMICONDUCTOR MANUFACTURING COMPANY, LTD., Hsinchu (TW)

(72) Inventors: Shih-Kang Fu, Hsinchu (TW);
Hsien-Chang Wu, Hsinchu (TW);
Ming-Han Lee, Hsinchu (TW);
Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 753 days.

(21) Appl. No.: 17/855,433

(22) Filed: Jun. 30, 2022

(65) Prior Publication Data

US 2024/0006233 A1     Jan. 4, 2024

(51) Int. Cl.
| | |
|---|---|
| *H10W 20/00* | (2026.01) |
| *H10W 20/41* | (2026.01) |
| *H10W 20/42* | (2026.01) |
| *H10W 20/44* | (2026.01) |

(52) U.S. Cl.
CPC ....... *H10W 20/033* (2026.01); *H10W 20/056* (2026.01); *H10W 20/062* (2026.01); *H10W 20/077* (2026.01); *H10W 20/081* (2026.01); *H10W 20/42* (2026.01); *H10W 20/425* (2026.01); *H10W 20/438* (2026.01); *H10W 20/4435* (2026.01)

(58) Field of Classification Search
CPC ............. H10W 20/033; H10W 20/056; H10W 20/062; H10W 20/077; H10W 20/081; H10W 20/42; H10W 20/425; H10W 20/438; H10W 20/4435
See application file for complete search history.

(56) References Cited

U.S. PATENT DOCUMENTS

| | | | |
|---|---|---|---|
| 2004/0113278 A1* | 6/2004 | Dalton | H01L 23/5226 |
| | | | 257/E23.145 |
| 2018/0158526 A1* | 6/2018 | Kim | H10D 89/10 |
| 2019/0244896 A1* | 8/2019 | Lee | H01L 21/02172 |

(Continued)

OTHER PUBLICATIONS

Ying Wang, Fei Cao, Mi-lin Zhang, Tao Zhang, Property improvement of Cu—Zr alloy films with ruthenium addition for Cu metallization, Acta Materialia, vol. 59, Issue 1, 2011, pp. 400-404, ISSN 1359-6454 (Year: 2010).*

(Continued)

*Primary Examiner* — Davienne N Monbleau
*Assistant Examiner* — Heim Kirin Grewal
(74) *Attorney, Agent, or Firm* — Birch, Stewart, Kolasch & Birch, LLP

(57)     ABSTRACT

A semiconductor device includes a substrate, an interconnect layer disposed over the substrate, a metal line formed in the interconnect layer, a dielectric layer disposed on the interconnect layer, and a via contact formed in the dielectric layer and electrically connected to the metal line. One of the via contact and the metal line includes a first metal material and a barrier metal layer disposed on the first metal material. The first metal material includes an alloy which is a mixture of two metal elements. The barrier metal layer includes one of the two metal elements.

20 Claims, 36 Drawing Sheets

(56)                  References Cited

U.S. PATENT DOCUMENTS

| | | | |
|---|---|---|---|
| 2020/0006228 A1* | 1/2020 | Yang | H10D 84/038 |
| 2021/0183786 A1* | 6/2021 | Hong | H10D 30/6757 |
| 2021/0296162 A1* | 9/2021 | Yu | H01L 21/0337 |
| 2022/0199759 A1* | 6/2022 | Chyi Liu | H01L 21/76831 |

OTHER PUBLICATIONS

California State University, Northridge (CSUN). "Standard Reduction Potentials" (PDF). csun.edu. Archived (PDF) from the original on Dec. 15, 2017. Retrieved Nov. 30, 2021. (Year: 2021).*

* cited by examiner

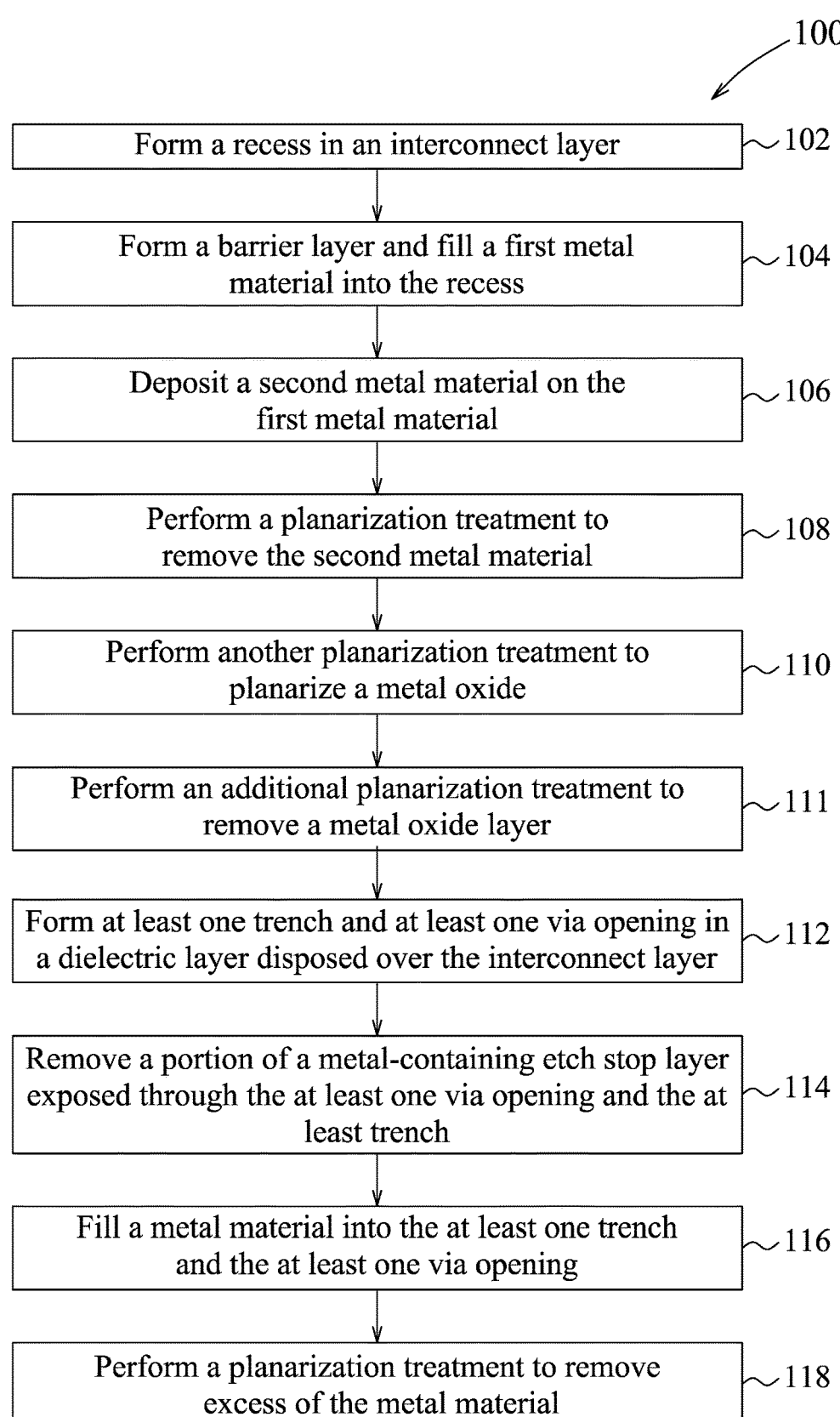

100

| Form a recess in an interconnect layer | ~102 |

| Form a barrier layer and fill a first metal material into the recess | ~104 |

| Deposit a second metal material on the first metal material | ~106 |

| Perform a planarization treatment to remove the second metal material | ~108 |

| Perform another planarization treatment to planarize a metal oxide | ~110 |

| Perform an additional planarization treatment to remove a metal oxide layer | ~111 |

| Form at least one trench and at least one via opening in a dielectric layer disposed over the interconnect layer | ~112 |

| Remove a portion of a metal-containing etch stop layer exposed through the at least one via opening and the at least trench | ~114 |

| Fill a metal material into the at least one trench and the at least one via opening | ~116 |

| Perform a planarization treatment to remove excess of the metal material | ~118 |

FIG. 19

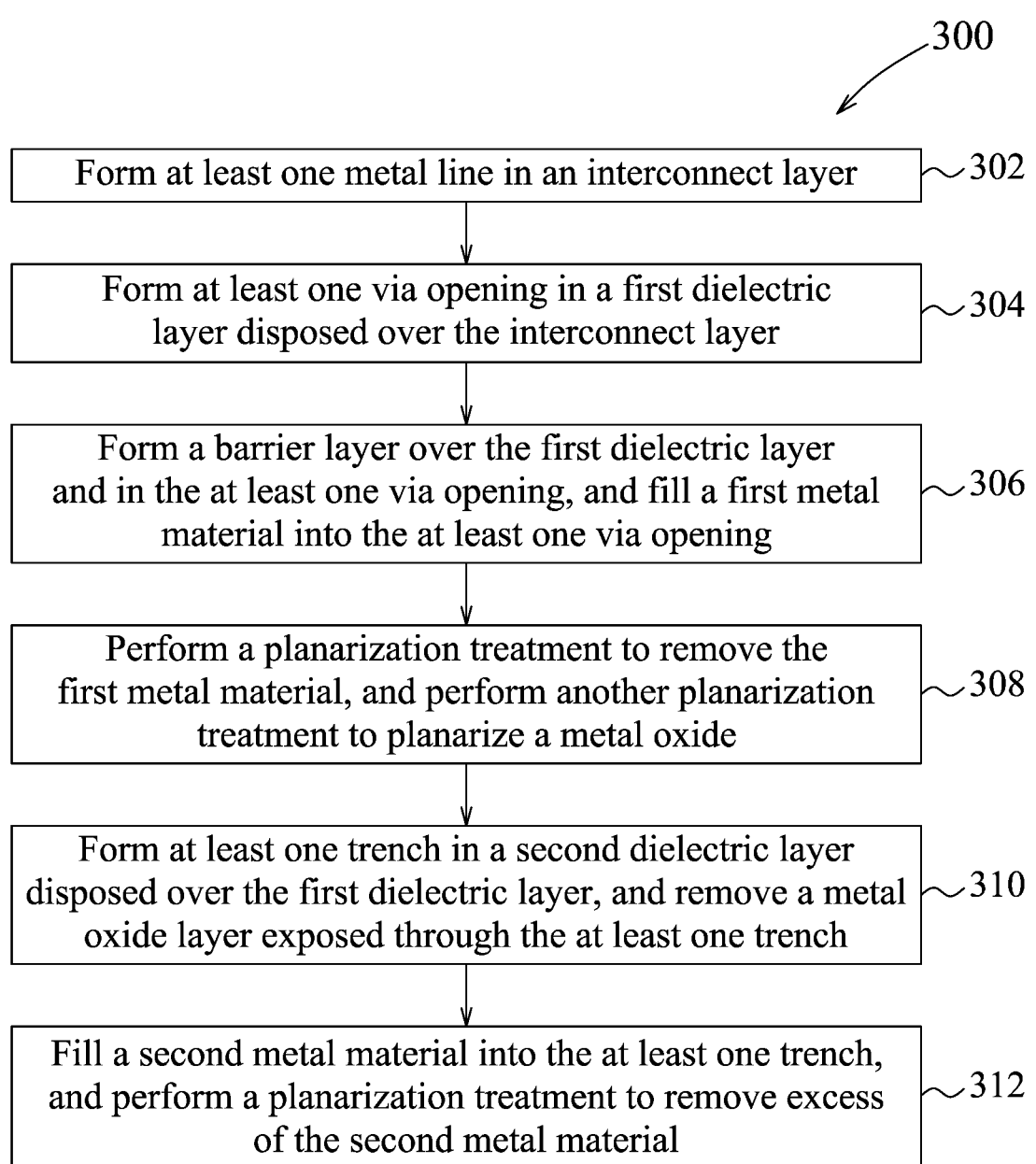

_300_

Form at least one metal line in an interconnect layer ~302

Form at least one via opening in a first dielectric
layer disposed over the interconnect layer ~304

Form a barrier layer over the first dielectric layer
and in the at least one via opening, and fill a first metal
material into the at least one via opening ~306

Perform a planarization treatment to remove the
first metal material, and perform another planarization
treatment to planarize a metal oxide ~308

Form at least one trench in a second dielectric layer
disposed over the first dielectric layer, and remove a metal
oxide layer exposed through the at least one trench ~310

Fill a second metal material into the at least one trench,
and perform a planarization treatment to remove excess
of the second metal material ~312

FIG. 30

SEMICONDUCTOR DEVICE INCLUDING A SELF-FORMED BARRIER METAL LAYER

BACKGROUND

With the advancement of semiconductor manufacturing processes, integrated circuits (ICs) have more functions and higher performance. A multilevel interconnect architecture is employed to achieve interconnections of a large number of electronic components, such as transistors, resistors, capacitors and diodes on a semiconductor substrate in an IC. Chemical mechanical polishing (CMP) is a process regularly used in formation of the multilevel interconnect architecture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a flow diagram illustrating a method for manufacturing a semiconductor device in accordance with some embodiments.

FIG. 30 is a flow diagram illustrating a method for manufacturing a semiconductor device in accordance with some embodiments.

DETAILED DESCRIPTION

Figure 1:
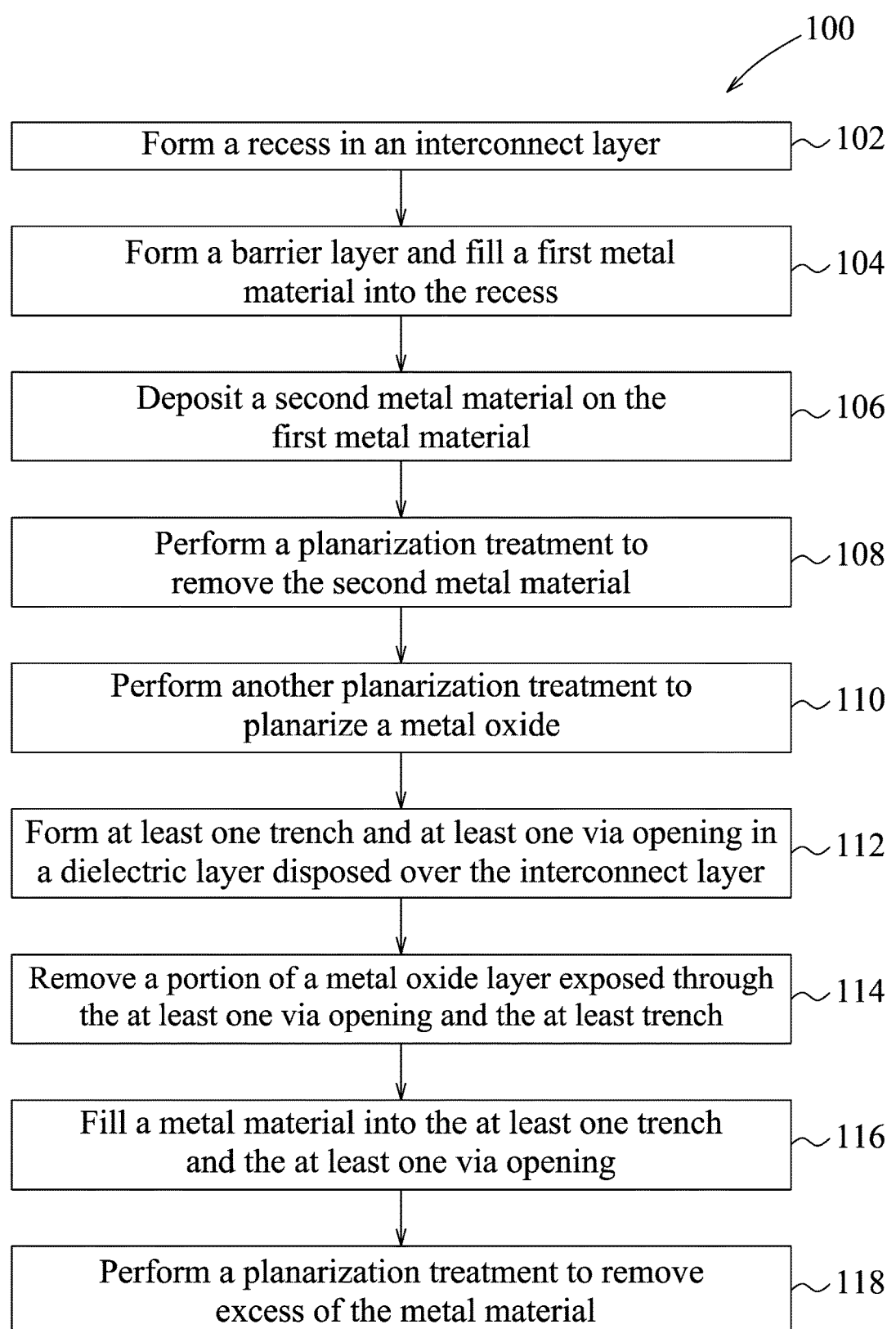
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "under," "upper," "lower," "downwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a multilevel interconnect architecture, an interconnect structure includes conductive lines which are formed in stacked dielectric layers and via contacts which are employed to connect the conductive lines from one layer to another layer. The interconnect lines and the via contacts may be fabricated using one or more damascene processes, including single or dual damascene processes, according to different embodiments. In a typical damascene process, a dielectric layer is deposited on a substrate or another layer, and the dielectric layer is etched in accordance with a mask pattern that corresponds to a desired via pattern (e.g., a via opening) and a line pattern (e.g., a trench). A diffusion barrier layer may be deposited on the dielectric layer and into the via pattern and the line pattern. In some embodiments, a liner layer may be deposited on the diffusion barrier layer. A conductive material, such as a metal material, is then filled into the via pattern and the line pattern. The diffusion barrier layer prevents the conductive material from diffusing into the dielectric layer and the substrate (or the another layer) to cause reliability issues. The liner layer is optionally formed, and provides adhesion between the conductive material and the diffusion barrier layer. The conductive material may be copper (Cu).

After the conductive material has been filled, a chemical mechanical polishing (CMP) process is carried out to remove excess portions of the conductive material, the liner layer and the diffusion barrier layer over a top surface of the dielectric layer, thereby forming an interconnect structure, which includes a via contact and a conductive line, in the dielectric layer. A CMP process is performed by polishing a substrate surface against a polishing pad which is applied with a CMP slurry containing reactive chemicals, abrasive particles and an oxidizing agent. The relative movement of the substrate surface and the polishing pad coupled with the reactive chemicals in the CMP slurry allows the CMP process to planarize the substrate surface by means of both physical and chemical forces. During the CMP process, the oxidizing agent, such as hydrogen peroxide ($H_2O_2$), in the CMP slurry aids in oxidizing a metal material on the substrate surface to its corresponding metal oxide. Afterward, the metal oxide is mechanically polished and removed with the polishing pad.

With the advancement of semiconductor technology toward newer generations, fabrication of interconnect structures using pure metal materials with low electrical resistance, such as tungsten, cobalt or copper, and CMP control with respect to these pure metal materials become more and more challenging. Therefore, alloys with relatively large mean free path, such as $Al_xRu_y$, $Al_xCu_y$, $Zr_xCu_y$, $Zr_xRu_y$, etc. (x is an integer ranging from 1 to 5, y is another integer ranging from 1 to 9), are used as materials for forming the interconnect structures to reduce grain boundary scattering, and are thus able to substitute for the pure metal materials. In this scenario, during a CMP process, an alloy is oxidized by an oxidizing agent, such as $H_2O_2$, $H_5IO_6$, $NaClO$, etc., contained in the CMP slurry into metal oxide on a top surface of the alloy, and a relatively high concentration of metal of a certain thickness is formed under the metal oxide. Specifically, a constituent metal element of the metal oxide derives from a metal element of the alloy having a lower reduction potential, such as aluminum (Al), manganese (Mn), zirconium (Zr), chromium (Cr), etc., while the relatively high concentration of metal formed under the metal oxide derives from another metal element of the alloy having a higher reduction potential, such as Cu, ruthenium (Ru), cobalt (Co), etc. In some embodiments, the metal oxide may be removed by another CMP process with an oxidant-free CMP slurry, and the another CMP process stops on a layer of the relatively high concentration of metal. Alternatively, in some embodiments, the another CMP process may be omitted, and the metal oxide may be used as an etch stop layer for a subsequent etching process.

The present disclosure is directed to a semiconductor device including a self-formed barrier metal layer, and a method for manufacturing the same. FIG. 1 illustrates a method 100 for manufacturing a semiconductor device in accordance with some embodiments. FIGS. 2 to 10 are schematic views of a semiconductor device 200 in accordance with some embodiments at some intermediate stages of the method 100 depicted in FIG. 1 for manufacturing a semiconductor device. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Figure 2:
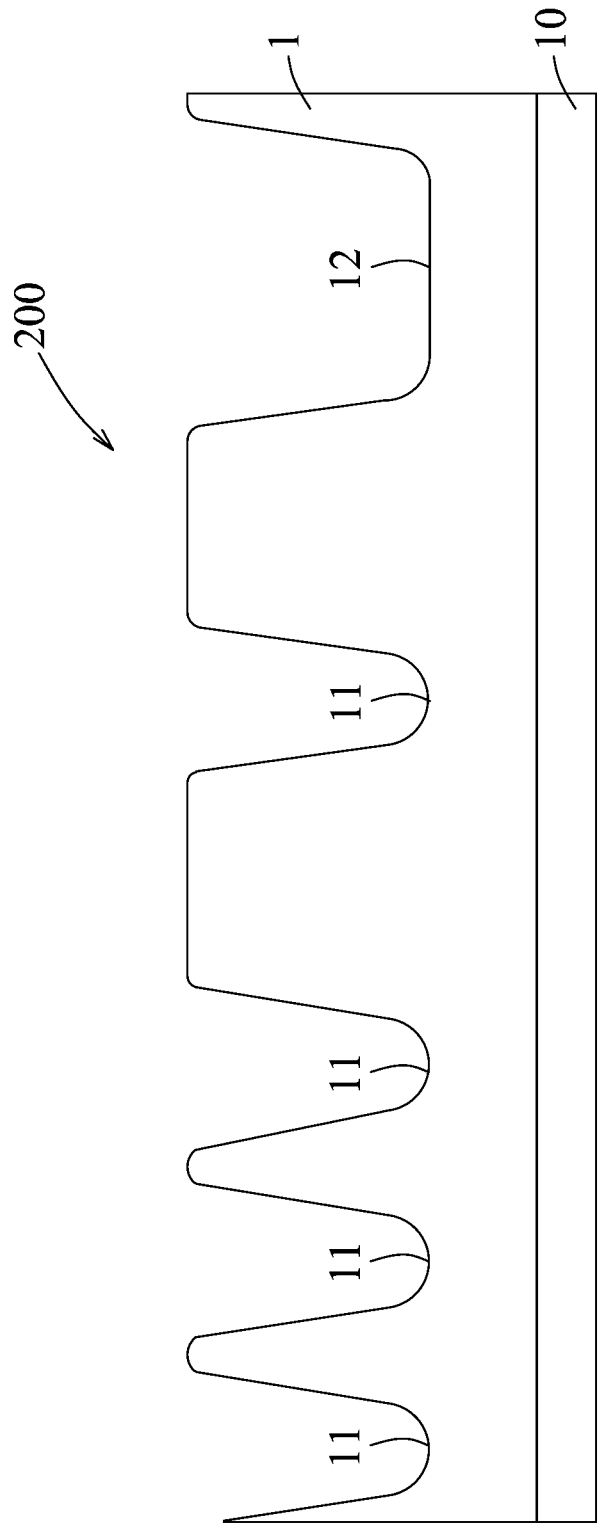
FIGS. 2 to 10 are schematic views illustrating some intermediate stages of the manufacturing method depicted in FIG. 1 in accordance with some embodiments.

Referring to FIG. 1 and the example illustrated in FIG. 2, the method 100 begins at step 102, where a recess is formed in an interconnect layer. FIG. 2 is a schematic view illustrating formation of a plurality of recesses in an interconnect layer 1 which is disposed over a substrate 10. The recesses are formed in the interconnect layer 1 by using patterning operations including lithography and etching processes.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure.

The SOI substrate may be doped with a P-type dopant, for example, but not limited to, boron (Br), aluminum (Al), or gallium (Ga). Alternatively, the SOI substrate may be doped with an N-type dopant, for example, but not limited to, nitrogen (N), phosphorous (P), or arsenic (As). In some embodiments, the semiconductor substrate may further include various active regions, for example, the active regions configured for an N-type metal oxide semiconductor transistor device (NMOS) or the active regions configured for a P-type metal oxide semiconductor transistor device (PMOS).

In some embodiments, the interconnect layer 1 may include dielectric materials, such as silicon oxide ($SiO_x$), silicon nitride ($SiN_x$), silicon carbide ($SiC_x$), silicon oxycarbide ($SiO_xC_y$), silicon oxynitride ($SiO_xN_y$), hydrogenated silicon oxycarbide ($SiO_xC_yH_z$), spin-on glass (SOG), amorphous fluorinated carbon, fluorinated silica glass (FSG), Black Diamond® (Applied Materials Inc., Santa Clara, Calif.), Xerogel, Aerogel, polyimide, Parylene, BCB (bis-benzocyclobutenes), Flare, SiLK™ (Dow Chemical Co., Midland, Mich.), non-porous materials, porous materials, other low-k dielectric materials, or combinations thereof. Other suitable materials are within the contemplated scope of the present disclosure. In some embodiments, the interconnect layer 1 may have a k-value ranging from about 1 to about 5. In some embodiments, the interconnect layer 1 may be formed by a suitable deposition process known to those skilled in the art of semiconductor fabrication, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pressure chemical vapor deposition (LPCVD). Other suitable techniques for forming the interconnect layer 1 are within the contemplated scope of the present disclosure. In some embodiments, it may be possible that the interconnect layer 1 is not directly disposed on the substrate 10, and other layers are disposed between the interconnect layer 11 and the substrate 10.

In some embodiments, a photoresist layer (not shown) is first applied over the interconnect layer 1 by, for example, spin on coating. The photoresist layer is then exposed to ultraviolet (UV) radiation. Exposed or unexposed portions of the photoresist layer are then removed depending on whether a negative or positive resist is used, creating a patterned photoresist layer having openings therein (not shown). The patterned photoresist layer exposes portions of the interconnect layer 1 where the recesses are to be formed. Once the patterned photoresist layer is formed, one or more etching processes are performed on the portions of the interconnect layer that are not covered by the patterned photoresist layer, thereby forming the recesses. A suitable etching process, for example, but not limited to, a plasma etching process, a sputter etching process, a reactive ion etching process, a deep-reactive ion etching process, or the like, is used to pattern the interconnect layer 1 so as to form the recesses. In some embodiments, an etch stop layer (not shown) may be used so that bottoms of the recesses can be defined. If an etch stop layer is not used, a depth of each of the recesses may be controlled by controlling an etching time or an etching rate of the etching process.

As shown in FIG. 2, the recesses include multiple first recesses 11 and a second recess 12. Each of the first recesses 11 has a width which is smaller than a width of the second recess 12. In some embodiments, the width of each of the first recesses 11 is in a range from about 10 nanometers (nm) to about 20 nm, and the width of the second recess 12 is in a range from about 40 nm to about 1 micrometer (m). The recesses correspond in shapes to metal lines, which are to be formed in a later stage and generally have a shape of a long extending line. The width of each of the recesses is defined in a direction perpendicular to the extending direction of the metal lines. Each of the first recesses 11 has a depth which is in a range from about 300 angstroms (Å) to about 800 Å. The second recess 12 has a depth which is substantially the same as the depth of each of the first recesses 11. According to the example illustrated in FIG. 2, two of the first recesses 11 are spaced apart from each other by a spacing which is in a range from about 10 nm to about 20 nm, while the remaining two of the first recesses 11 are spaced apart from each other by another spacing which is in a range from about 40 nm to about 0.5 μm.

Figure 3:
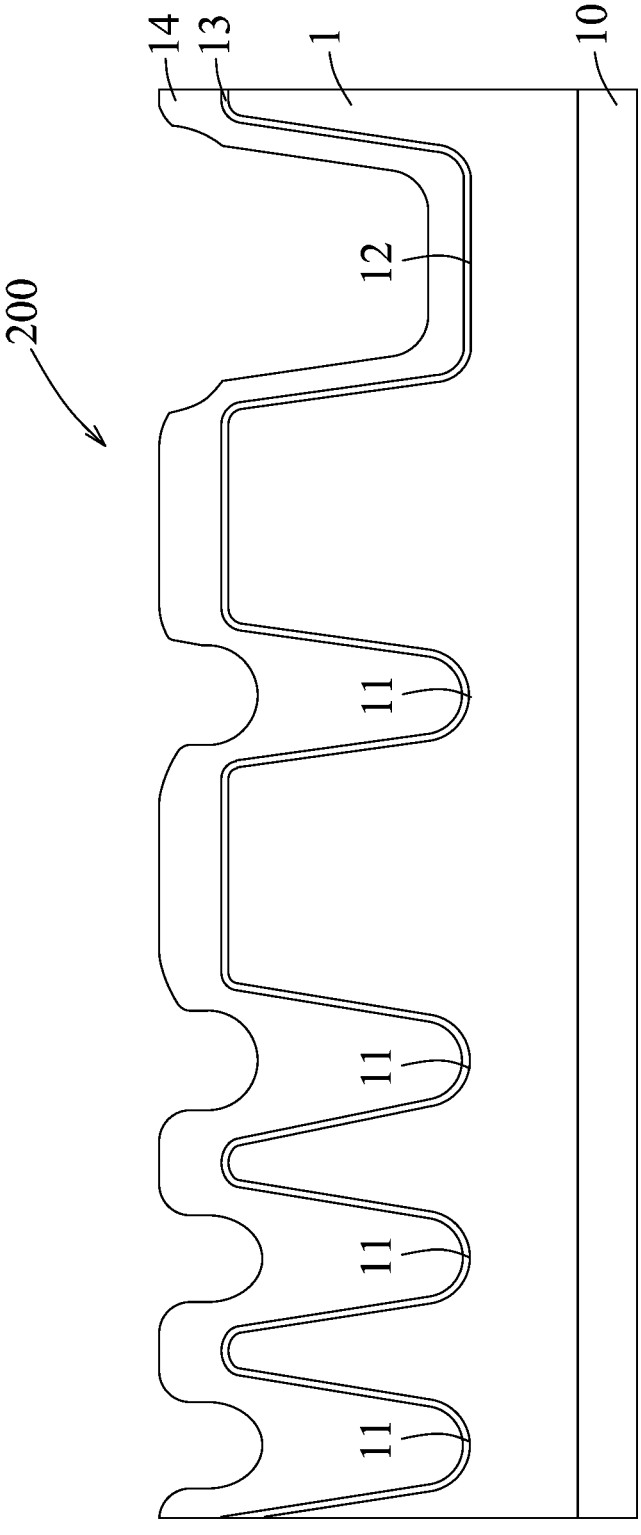

Referring to FIG. 1 and the example illustrated in FIG. 3, the method 100 then proceeds to step 104, where a barrier layer is formed over the interconnect layer and in the recess, and a first metal material is filled into the recess. A barrier layer 13 is deposited on the interconnect layer 1 and in the recesses by using CVD, PVD, ALD or electro-plating such as electrodeless plating. The barrier layer 13 has a thickness ranging from about 1 Å to about 100 Å. In some embodiments, the barrier layer 13 may include, for example, but not limited to, transition metal nitride, such as tantalum nitride (TaN), titanium nitride (TiN), tungsten nitride (WN) or zirconium nitride (ZrN), aluminum nitride (AlN), $SiO_xC_y$, or other suitable materials. In some embodiments, the barrier layer 13 may be a self-formed barrier layer, and an annealing process may be used to form the self-formed barrier layer. The annealing process may be, for example, but not limited to, a rapid thermal annealing (RTA) process, a laser process, a furnace annealing process, or other suitable annealing techniques. The self-formed barrier layer may include, for example, but not limited to, Al, Mn, Zr, Cr, $Al_xO_y$, $Mn_xO_y$, $Zr_xO_y$, $Cr_xO_y$, $Al_4Si_3$, MnSi, $MnSi_2$, $Mn_5Si_3$, $ZrSi_2$, $Cr_3Si$, $Cr_5Si_3$, CrSi, $CrSi_2$, or the like.

A first metal material 14 is then filled into the recesses and is deposited on the barrier layer 13 by a suitable deposition process as is known to those skilled in the art of semiconductor fabrication, for example, CVD, PECVD, PVD, or the like. In some embodiments, an annealing process may be used during or following the deposition process, and may be performed at a temperature ranging from about 150° C. to about 1000° C. The annealing process may be, for example, but not limited to, an RTA process, a furnace annealing process, or other suitable annealing techniques. In some embodiments, the first metal material 14 includes an alloy, which is a mixture of two metal elements and is presented as $A_xB_y$, where A is a relatively active metal element having a lower reduction potential, such as Al, Mn, Zr, Cr, etc., B is a relatively noble metal element having a higher reduction potential, such as Cu, Ru, Co, etc., x is an integer ranging from 1 to 5, and y is another integer ranging from 1 to 9. In the example shown in FIG. 3, the first metal material 14 is deposited by using the CVD process, is conformally formed on the barrier layer 13 in the wider second recess 12, and has a thickness ranging from about 5 nm to about 10 nm in the second recess 12. On the other hand, the first metal material 14 substantially fills up the narrower first recesses 11, and has a thickness ranging from about 300 Å to about 800 Å in the first recesses 11.

Figure 4:
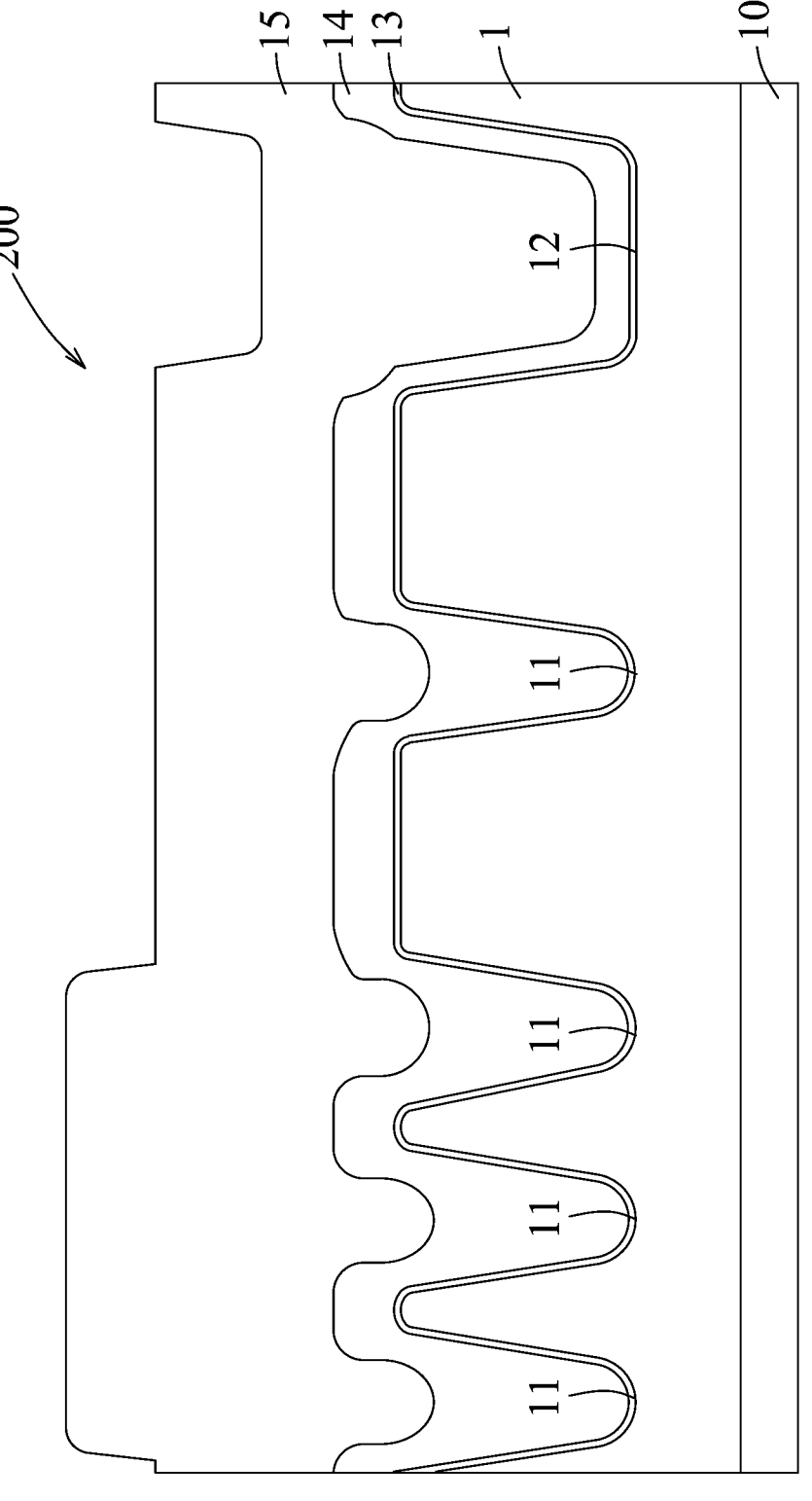

Referring to FIG. 1 and the example illustrated in FIG. 4, the method 100 then proceeds to step 106, where a second metal material is deposited on the first metal material. A second metal material 15 is deposited on the first metal material 14 and in the recesses by using electro chemical plating (ECP), PVD, or the like. Other suitable depositing techniques are within the contemplated scope of the disclosure. In some embodiments, the second metal material 15 may include Cu, Co, Ru, or other suitable materials, and may have a thickness ranging from about 2000 Å to about 6000 Å. In the example shown in FIG. 4, the second metal material 15 is filled into the wider second recess 12 and is deposited on the first metal material 14 in the second recess 12 so as to form a hybrid metal structure including the first and second metal materials 14, 15 in the second recess 12. In some embodiments, the thickness of the first metal material 14 of the hybrid metal structure ranges from about 5 nm to about 10 nm, and the second metal material 15 of the hybrid metal structure has a thickness ranging from about 40 nm to about 0.9 μm. On the other hand, the second metal material 15 is slightly filled in the narrower first recesses 11.

Figure 5:
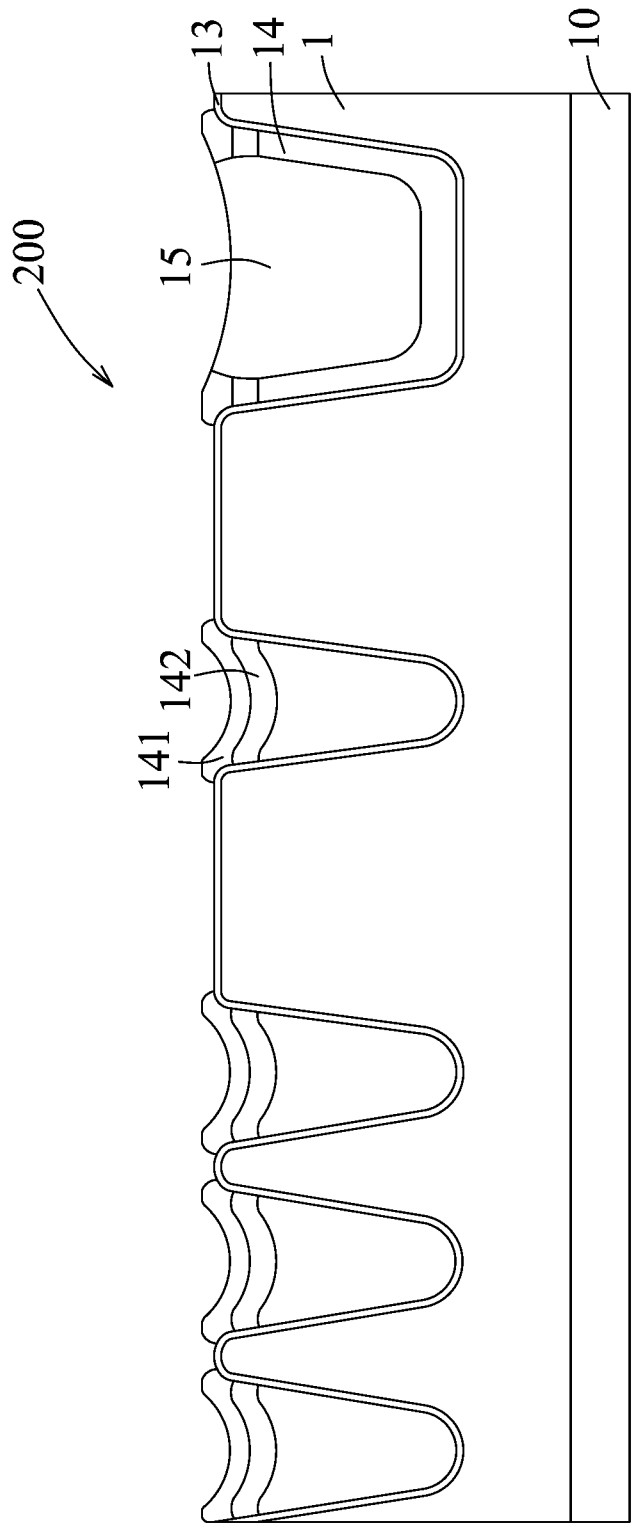

Referring to FIG. 1 and the example illustrated in FIG. 5, the method 100 then proceeds to step 108, where a planarization treatment (e.g., CMP) is performed to remove the second metal material. A first CMP process is performed to remove excess of the second metal material 15 and the first metal material 14 over a top surface of the interconnect layer 1. The first CMP process stops upon reaching the barrier layer 13 disposed on the top surface of the interconnect layer 1, such that after the first CMP process, a top surface of the barrier layer 13 is exposed. The first CMP process is performed using a first CMP slurry which enables at least a 10:1:1 removal rate selectivity of the second metal material 15, the first metal material 14 and the interconnect layer 1. The first CMP slurry thus removes the bulk of the second metal material 15 and a portion of the first metal material 14 from the top surface of the interconnect layer 1, while the interconnect layer 1 is kept intact under the barrier layer 13. Therefore, the first CMP process is also known as a bulk CMP process. After the first CMP process is performed, the remainder of the second metal material 15 is left in the second recess 12 such that the hybrid metal structure is maintained in the second recess 12. In some embodiments, the first CMP slurry includes an abrasive, an oxidizing agent, a surfactant and a metal corrosion inhibitor. The abrasive includes abrasive particles dispersed in an aqueous solvent, such as water. The abrasive mechanically polishes the second metal material 15 and the first metal material 14. Examples of abrasive include, but are not limited to, $SiO_2$, $CeO_2$, $Al_2O_3$, or other suitable materials. The abrasive is stabilized with the surfactant. Examples of the surfactant include, for example, but not limited to, alkyl sulfates, carboxylates, and alkyl phosphates having carbon backbones in the range of from C10 to C14. A mass percentage of the abrasive and the first CMP slurry ranges from about 1% to about 4%. The oxidizing agent is used to oxidize the relatively active metal element A in the first metal material 14 (i.e., the alloy $A_xB_y$) into its corresponding oxide. For example, in some embodiments, a metal oxide 141 (e.g., $A_xO_z$, where A is the relatively active metal element from the alloy, x is an integer ranging from 1 to 5, and z is another integer ranging from 1 to 5, such as $Al_2O_3$) is induced, and a relatively high concentration of the relatively noble metal element B originally contained in the alloy is formed (referred to as a purer metal 142 hereinafter) under the metal oxide 141. In some embodiments, the oxidizing agent may include, for example, but not limited to $H_2O_2$, $H_5IO_6$, NaClO, or other suitable oxidants. A mass percentage of the oxidizing agent and the first CMP slurry ranges from about 0.1% to about 4%. The corrosion inhibitor is used to prevent corrosion of metal during the first CMP process. In some embodiments, the corrosion inhibitor includes benzotriazole and/or its derivatives. In some embodiments, the first CMP slurry may include a buffer, and the buffer may be used to maintain a pH level of the first CMP slurry in a range from about 3 to about 10. Examples of the buffer include, but are not limited to, citric acid and potassium citrate, acetic acid and potassium citrate, and phosphoric acid and potassium phosphate.

The first CMP slurry is applied to a polishing pad disposed on a platen or is directly dispensed onto a surface to be polished. Polishing parameters such as down force, slurry flow rate, table speed, head speed, and pad type may be adjusted to effect the results of the first CMP process. In some embodiments, the down force is in a range from about 0.5 psi to about 2.75 psi, the table speed (i.e., a rotational speed of the polishing pad) is in a range of from about 30 to about 130 revolutions per minute (rpm), and the head speed (i.e., a rotational speed of a carrier for holding a wafer) is in a range of from about 20 rpm to about 120 rpm. The polishing end point of the first CMP process is monitored by measuring eddy current or optical reflection from the surface being polished.

Figure 6:
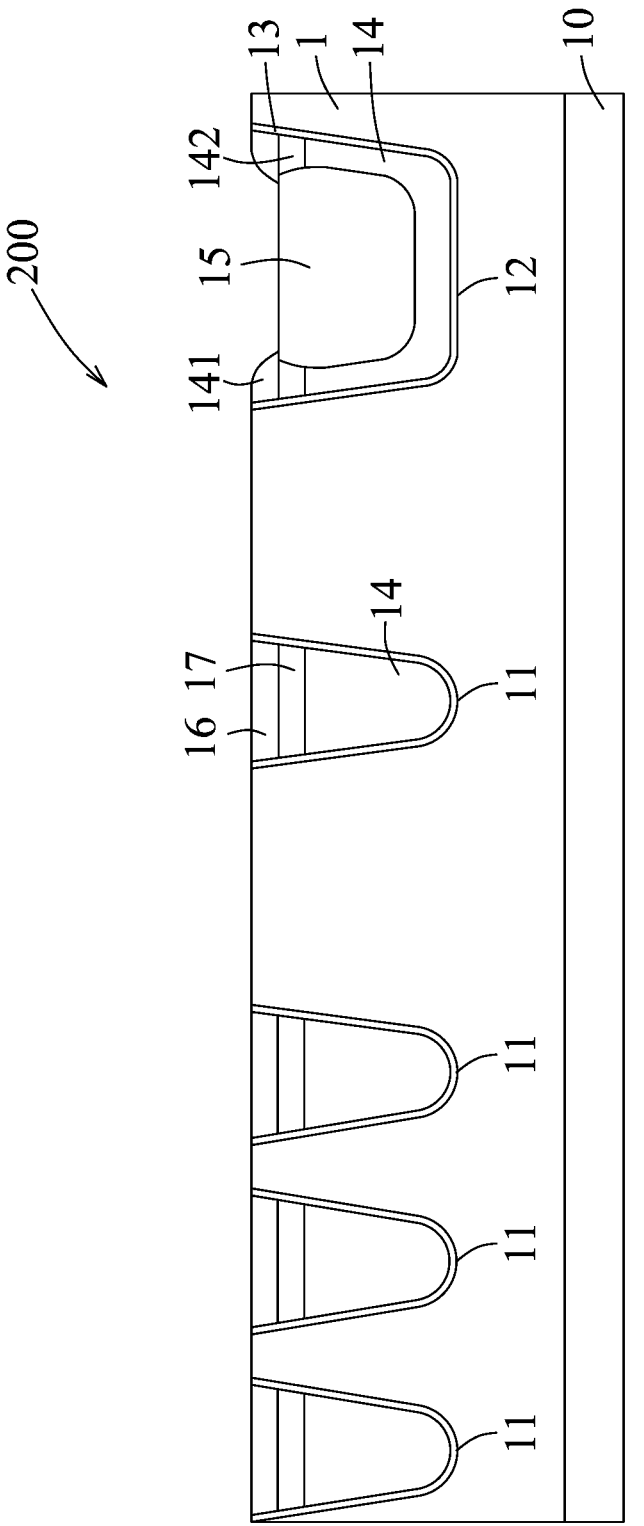

Referring to FIG. 1 and the example illustrated in FIG. 6, the method 100 then proceeds to step 110, where another planarization treatment (e.g., CMP) is performed to planarize the metal oxide. A second CMP process is performed to remove the metal oxide 141, the purer metal 142, the barrier layer 13 over the top surface of the interconnect layer 1 and a portion of the interconnect layer 1, to form a metal oxide layer 16 and to buff a top surface of the semiconductor device 200. Therefore, the second CMP process is also known as a buffing CMP process. The second CMP process is performed using a second CMP slurry which enables a 1:1:1 removal rate selectivity of the second metal material 15, the first metal material 14 and the interconnect layer 1. The second CMP process stops when the metal oxide layer 16 is formed. In some embodiments, the second CMP slurry includes an abrasive, an oxidizing agent, a surfactant and a metal corrosion inhibitor. The abrasive mechanically polishes the metal oxide 141, the purer metal 142 formed under the metal oxide 141, the barrier layer 13 and the interconnect layer 1. Examples of abrasive include, but are not limited to, $SiO_2$, $TiO_2$, $Al_2O_3$, or other suitable materials. The oxidizing agent is used to oxidize the relatively active metal element A in the first metal material 14 (i.e., the alloy $A_xB_y$) into its corresponding oxide. In this way, the second CMP slurry induces more metal oxide $A_xO_z$ 141 so as to form the metal oxide layer 16, and more of the purer metal 142 is generated so as to form a barrier metal layer 17 under the metal oxide layer 16. Since the metal oxide layer 16 and the barrier metal layer 17 are formed during a CMP process, rather than specifically formed using deposition processes, the metal oxide layer 16 and the barrier metal layer 17 may be referred to as a self-formed metal oxide layer and a self-formed barrier metal layer. In some embodiments, the second CMP slurry may include a buffer, and the buffer may be used to maintain a pH level of the second CMP slurry in a range from about 9 to about 11. Other parameters related to the abrasive, the surfactant, the oxidizing agent, the corrosion inhibitor and the buffer contained in the second CMP slurry may be similar to those of the first CMP slurry, and details thereof are omitted for the sake of brevity. In some embodiments, the metal oxide layer 16 and the barrier metal layer 17 formed in each of the first recesses 11 have substantially flat profiles as exemplarily shown in FIG. 6. The metal oxide layer 16 may have a thickness ranging from about 20 Å to about 50 Å. In some embodiments, the metal oxide layer 16 may have a thickness ranging from about 22 Å to about 45 Å. In this way, the metal oxide layer 16 may serve as a self-formed metal oxide etch stop layer for an etching process in a later stage. It is noted that if the thickness is less than 20 Å, the metal oxide layer 16 may not serve the purpose of an etch stop layer; if the thickness is greater than 50 Å, dishing of the metal oxide layer 16 may occur, that is, the metal oxide layer might not be flat. The barrier metal layer 17 may have a thickness ranging from about 10 Å to about 40 Å. The barrier metal layer 17 and the first metal material 14 formed in each of the first recesses 11 and covered by the metal oxide layer 16 serve as a metal line. For the hybrid metal structure in the wider second recess 12, since the first metal material 14 is located at lateral and bottom regions while the second metal material 15 is located at a central region, the metal oxide 141 induced from the first metal material 14 and the purer metal 142 generated under the metal oxide 141 are formed on lateral sides and over the first metal material 14 in the second recess 12, while the second metal material 15 is exposed from a top surface of the hybrid metal structure. The purer metal 142 and the hybrid metal structure also serve as a metal line.

The second CMP slurry is applied to the polishing pad disposed on the platen or is directly dispensed onto a surface to be polished. Polishing parameters such as down force, slurry flow rate, table speed, head speed, and pad type may be adjusted to effect the results of the second CMP process. In some embodiments, the down force is in a range from about 0.5 psi to about 2.0 psi, the table speed (i.e., the rotational speed of the polishing pad) is in a range of from about 60 to about 90 rpm, and the head speed (i.e., a rotational speed of a carrier for holding a wafer) is in a range from about 50 rpm to about 80 rpm.

Figure 7:
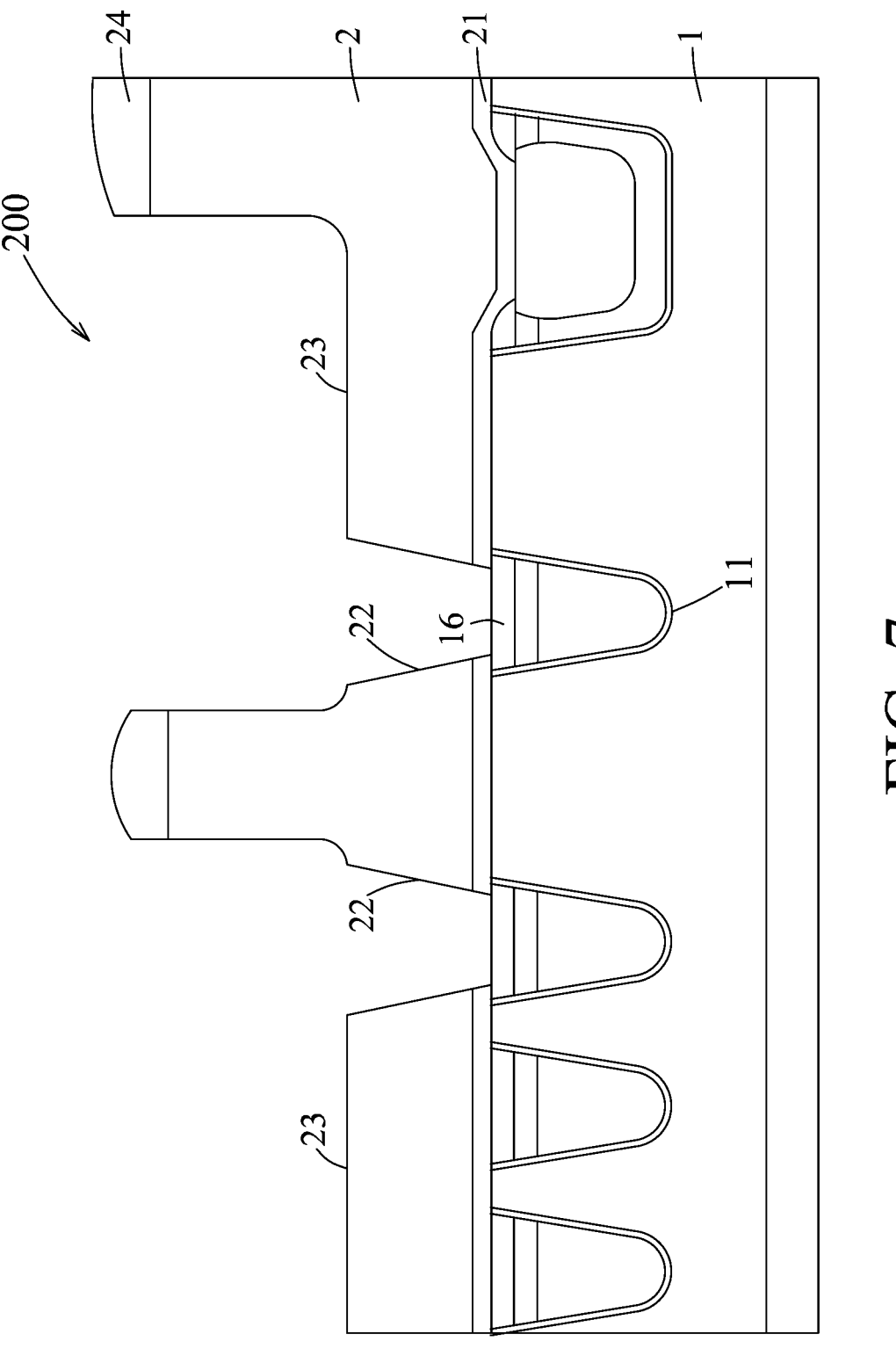

Referring to FIG. 1 and the example illustrated in FIG. 7, the method 100 then proceeds to step 112, where at least one trench and at least one via opening are formed in a dielectric layer which is disposed over the interconnect layer. In the example shown in FIG. 7, an etch stop layer 21 and a dielectric layer 2 are sequentially formed on the interconnect layer 1 and the metal oxide layer 16, and then a plurality of via openings and a plurality of trenches (e.g., two via openings 22 and two trenches 23) are formed by patterning the dielectric layer 2 and the etch stop layer 21 using one or more etching processes (for example, but not limited to, a dry etching process, a wet etching process, or a combination thereof) through a pattern of openings formed in a patterned mask layer 24 so as to expose portions of the metal oxide layer 16 through the via openings 22 and corresponding ones of the trenches 23 that are connected to the via openings 22. In some embodiments, the dielectric layer 2 is etched by a dry etching process using a halide based (e.g., fluorine based) etching gas. In some embodiments, the etch stop layer 21 is formed by a suitable deposition process as is known in the art of semiconductor fabrication, such as PVD, CVD, ALD, plasma enhanced ALD (PEALD), thermal ALD, PECVD, or the like. In some embodiments, the etch stop layer 21 is a non-metallic etch stop layer. The etch stop layer 21 may have a thickness ranging from about 20 Å to about 200 Å, and may include SiC, carbon-doped silicon nitride (SiCN), oxide doped carbide (ODC), other dielectric materials or other suitable materials. It is noted that the metal oxide layer 16 may also serve as an etch stop layer (e.g., a metal oxide etch stop layer) during said one or more etching processes. The trenches 23 are recessed downwardly from a top surface of the second dielectric layer 2, and the via openings 22 extend from corresponding ones of the trenches 23 and reach the portions of the metal oxide layer 16. The via openings 22 are disposed below and in spatial communication with the corresponding ones of the trenches 23.

Figure 8:
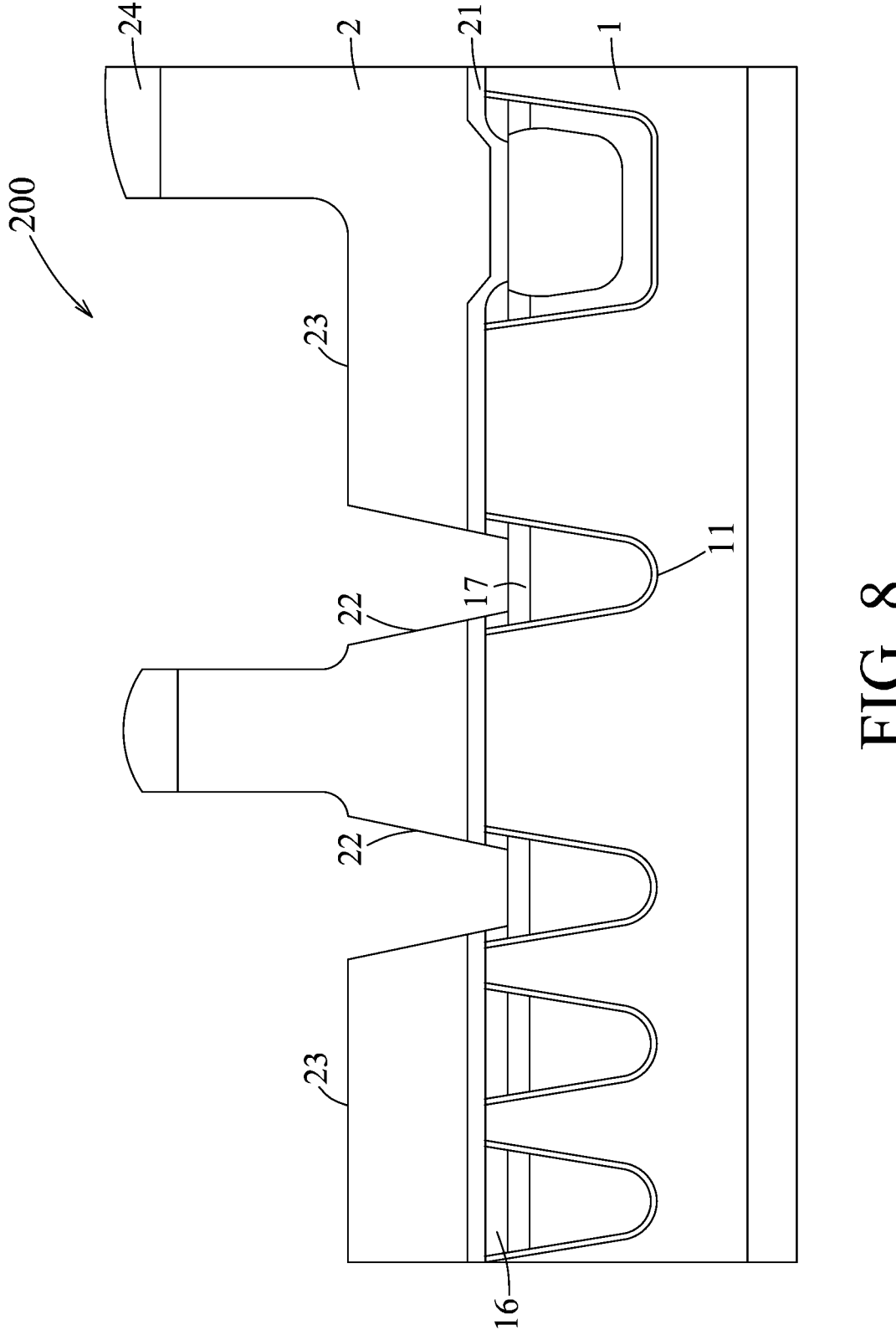

Referring to FIG. 1 and the example illustrated in FIG. 8, the method 100 then proceeds to step 114, where a portion of the metal oxide layer exposed through the at least one via opening and the at least trench is removed. In the example shown in FIG. 8, the portions of the metal oxide layer 16 which are exposed through the via openings 22 and the trenches 23 are removed by using a wet cleaning process, so that portions of the barrier metal layer 17 which were previously covered by the portions of the metal oxide layer 16 are exposed through the via openings 22 and the trenches 23. In some embodiments, top surfaces of the portions of the barrier metal layer 17 formed in corresponding ones of the first recesses 11 are recessed with respect to the top surface of the interconnect layer 1 by a distance ranging from about 0 Å to about 50 Å, and each of the portions of the barrier metal layer 17 has a thickness ranging from about 5 Å to about 40 Å. In some embodiments, the wet cleaning process may be performed using $H_2O_2$ which has a mass percentage that is greater than 0% and has an upper limit of about 10%, and a pH level ranging from about 3 to about 10 in mixture with a buffer solution.

Figure 9:
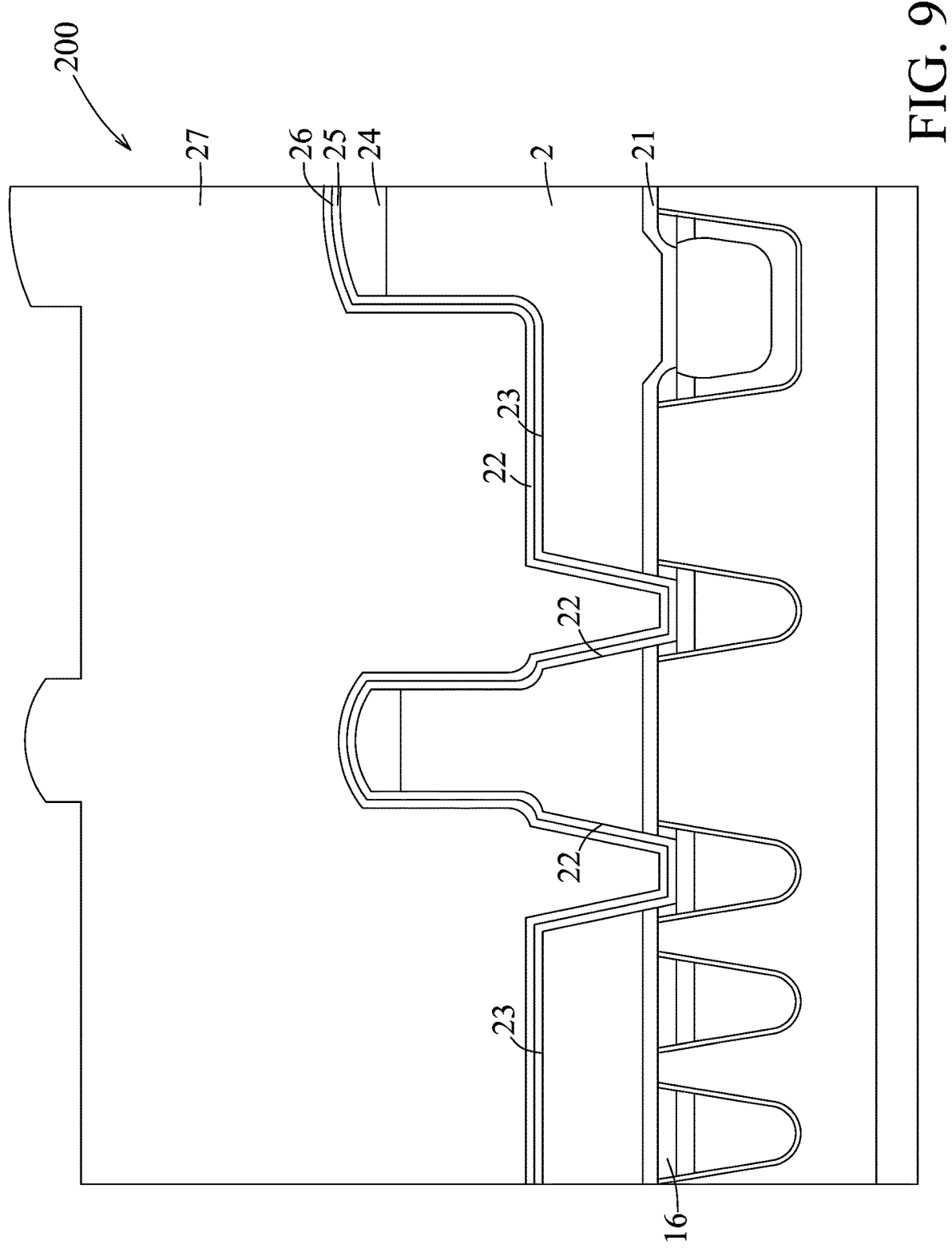

Referring to FIG. 1 and the example illustrated in FIG. 9, the method 100 then proceeds to step 116, where a metal material is filled into the at least one trench and the at least one via opening. In the example of FIG. 9, a metal barrier layer 25 and a metal liner layer 26 are sequentially formed in the trenches 23 and the via openings 22, and a metal material 27 is then filled into the trenches 23 and the via openings 22 and deposited on the metal liner layer 26.

The metal barrier layer 25 is conformally formed in the trenches 23 and the via openings 22 by a suitable deposition process as is known to those skilled in the art of semiconductor fabrication, for example, PVD, CVD, PECVD, ALD, PEALD, or the like. The metal barrier layer 25 may include, for example, but not limited to, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum, tantalum nitride, tantalum silicon nitride, tantalum oxide, tantalum silicon oxide, titanium nitride, titanium silicon nitride, titanium oxide, titanium silicon oxide, or combinations thereof. Other suitable metal barrier materials are within the contemplated scope of the present disclosure.

The metal liner layer 26 is then conformally formed on the metal barrier layer 25 by a suitable deposition process as is known to those skilled in the art of semiconductor fabrication, for example, PVD, CVD, PECVD, ALD, PEALD, or the like. In some embodiments, the metal liner layer 26 may include, for example, but not limited to, metals (e.g., Cu, silver (Ag), gold (Au), Al, nickel (Ni), Co, Ru, iridium (Ir), platinum (Pt), palladium (Pd), osmium (Os), tungsten (W), molybdenum (Mo), tantalum (Ta), or the like), alloys of the metals, the nitride, carbide, silicide compounds of the metals, or the like, combinations thereof, or other suitable metal liner materials.

The metal material 27 is filled into the trenches 23 and the via openings 22 by a suitable deposition process as is known to those skilled in the art of semiconductor fabrication, for example, selective or non-selective PVD, selective or non-selective CVD, selective or non-selective PECVD, selective or non-selective ALD, selective or non-selective PEALD, electroless deposition (ELD), ECP, or the like. In some embodiments, the metal material 27 may include, for example, but not limited to, metals (e.g., Cu, Ag, Au, Al, Ni, Co, Ru, Ir, Pt, Pd, Os, W, Mo, Ta, or the like), alloys thereof possessing promising conductive properties, or other suitable materials.

Figure 10:
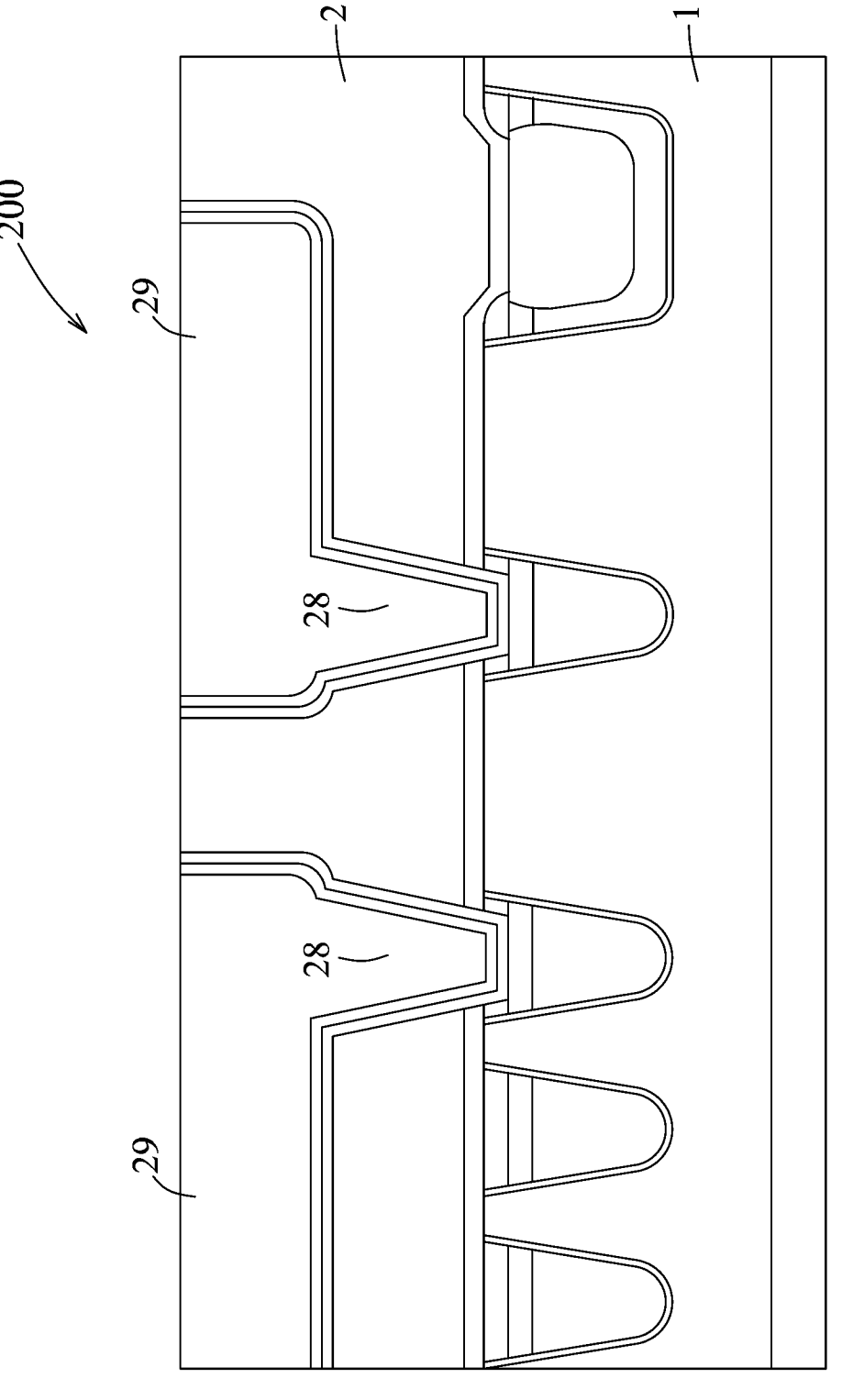

Referring to FIG. 1 and the example illustrated in FIG. 10, the method 100 then proceeds to step 118, where a planarization treatment (e.g., CMP) is performed to remove excess of the metal material. A CMP process is performed to remove excess of the metal material 27 and the dielectric layer 2, and the patterned mask layer 24 (see FIG. 9) so as to form an interconnect structure in the dielectric layer 2. The interconnect structure includes at least one via contact and at least one conductive line (two via contacts 28 and two conductive lines 29 are exemplarily illustrated in FIG. 10). The via contacts 28 are disposed in a lower portion of the dielectric layer 2. The conductive lines 29 are disposed in an upper portion of the dielectric layer 2, and are electrically connected to corresponding ones of the metal lines formed in the interconnect layer 1 through the via contacts 28, respectively.

As a result, a multilevel interconnect architecture may be fabricated by the method 100 for manufacturing a semiconductor device according to some embodiments of this disclosure. The multilevel interconnect architecture includes the metal lines which are formed in the interconnect layer and the conductive lines which are formed in the dielectric layer and which are connected to the metal lines through the via contacts. The metal lines include the first metal material which is an alloy with relatively large mean free path that can substitute for purer metal material. In addition, the metal oxide layer induced from the alloy during the CMP processes for forming the metal lines can be used as a self-formed metal oxide etch stop layer for a following etching process in a later stage where a dual damascene process is performed for forming the conductive lines and the via contacts in the dielectric layer disposed over the interconnect layer. In this way, a step of forming a metal oxide etching stop layer may be omitted, saving time and cost of manufacturing semiconductor devices.

Figure 13:
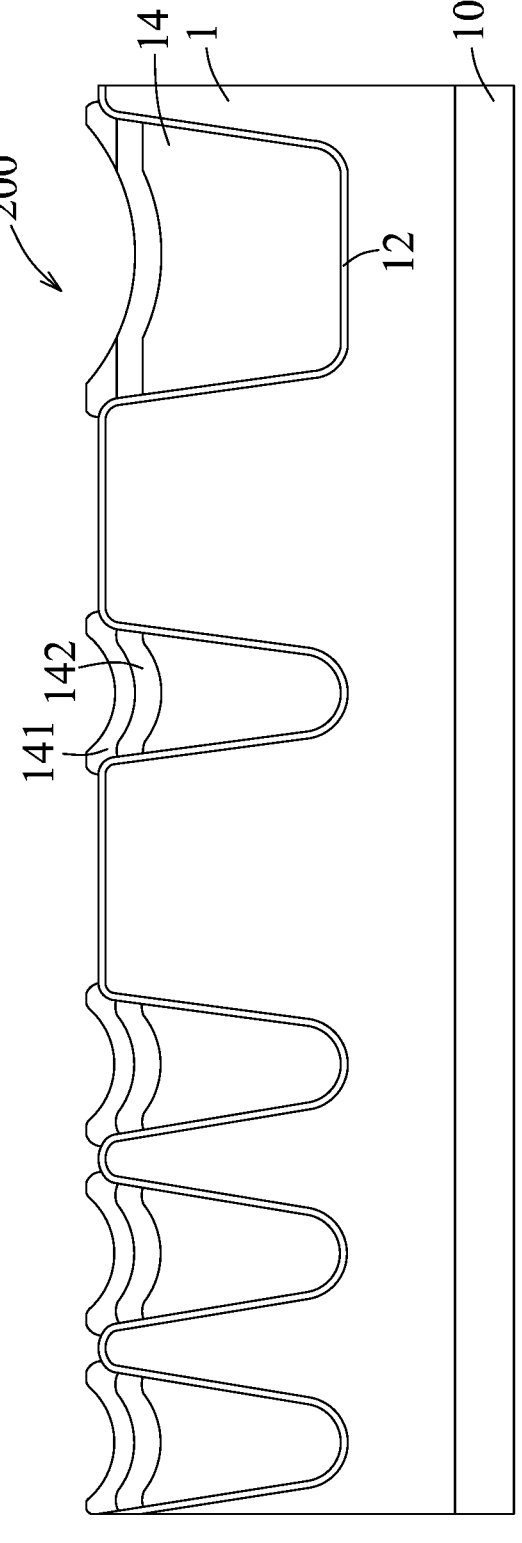
Figure 14:
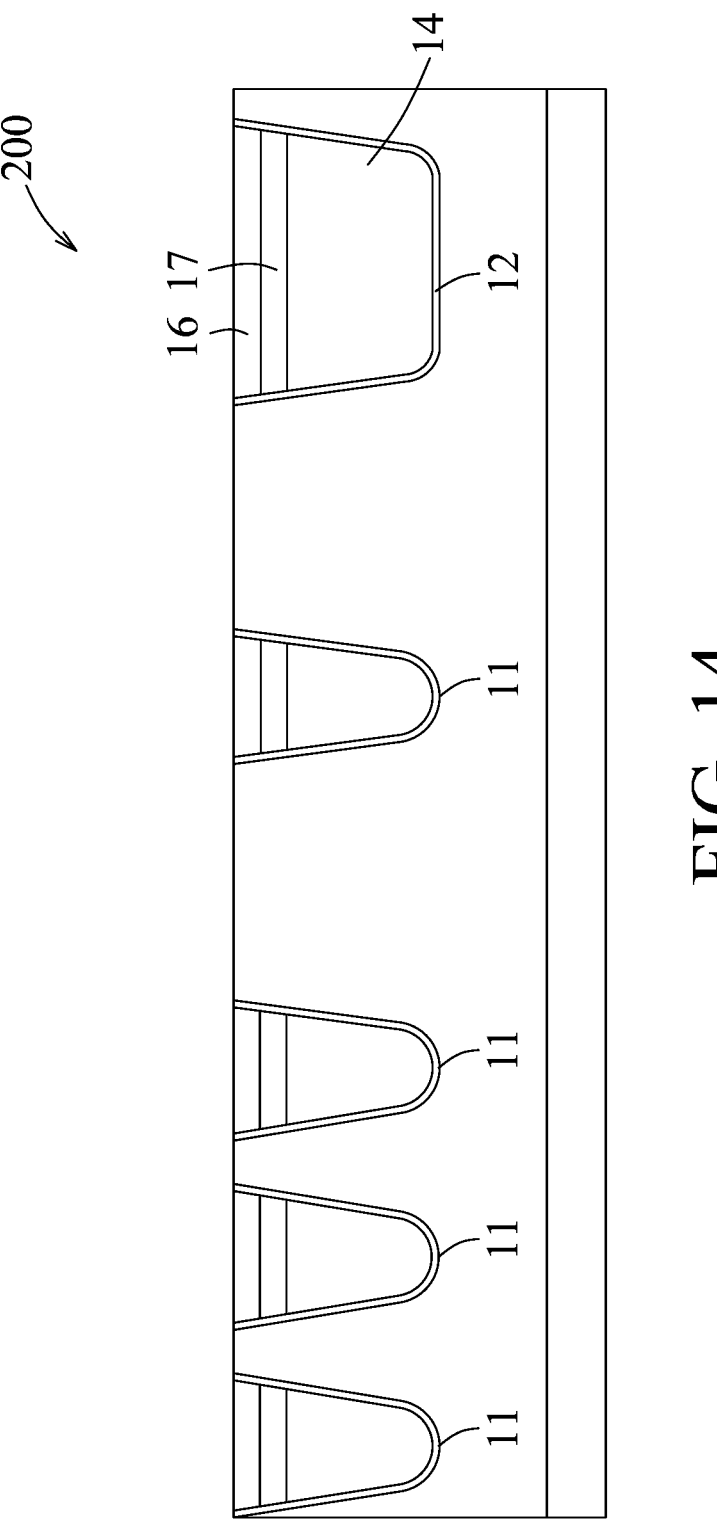
Figure 15:
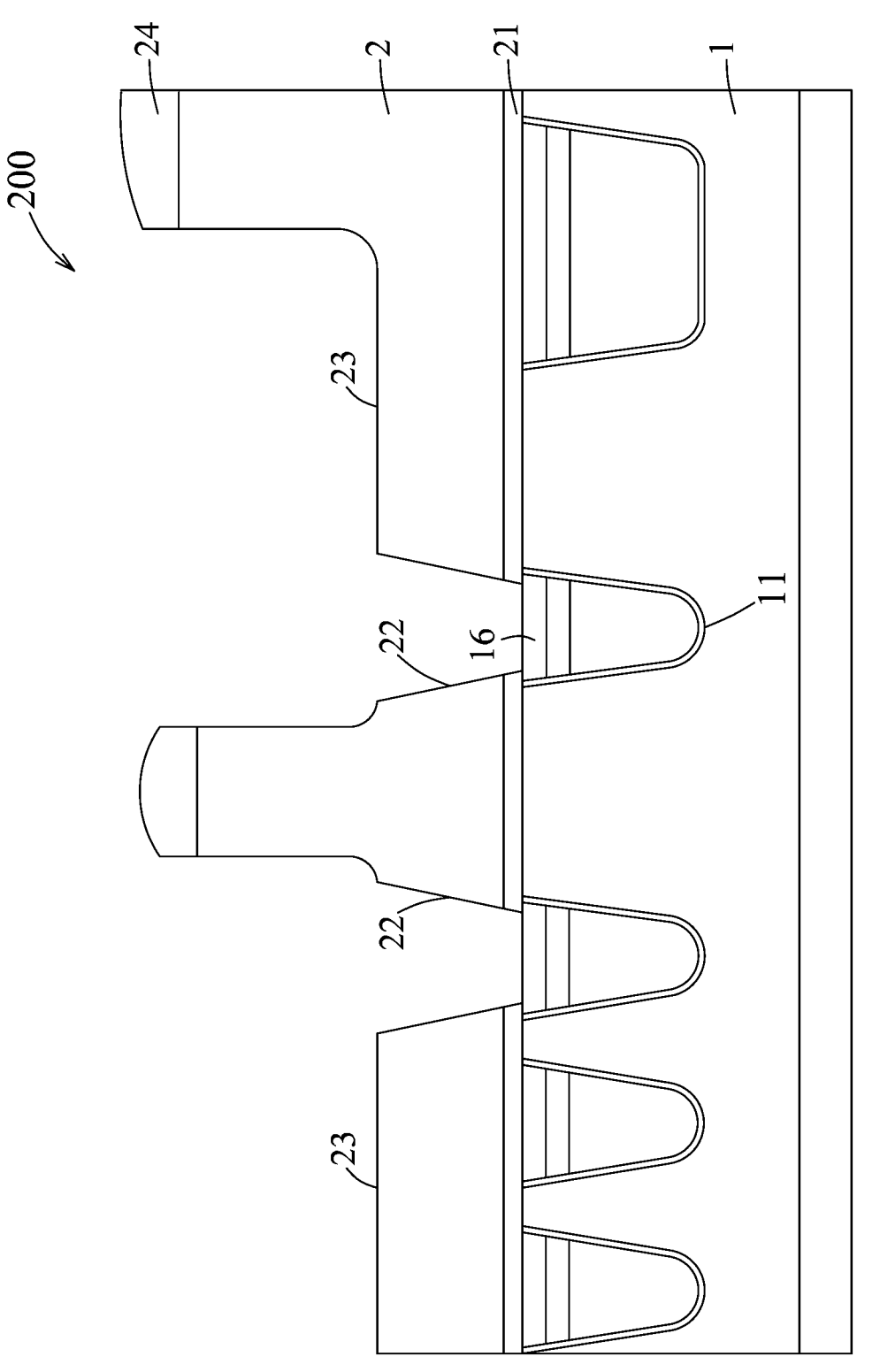
Figure 16:
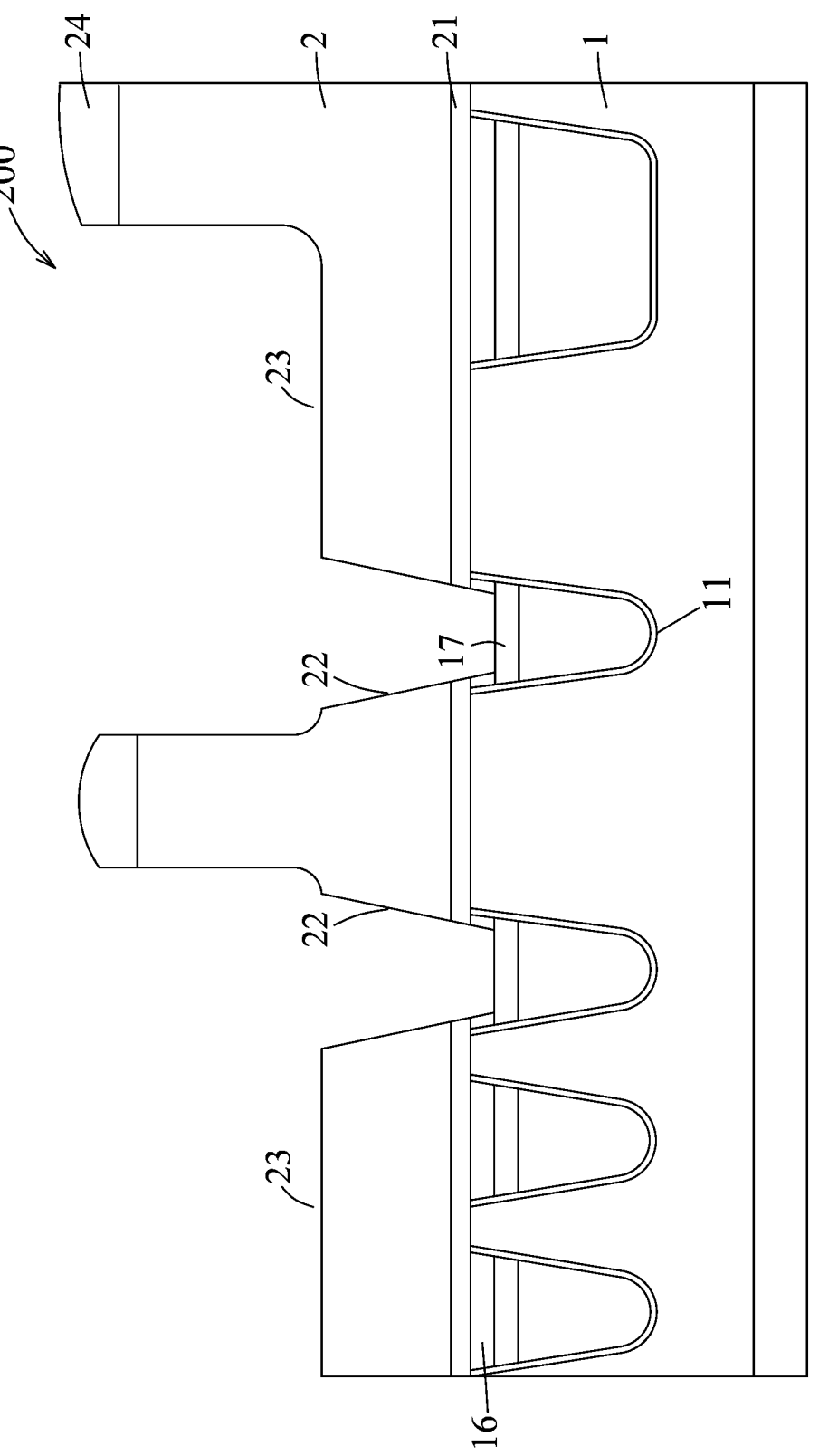
Figure 17:
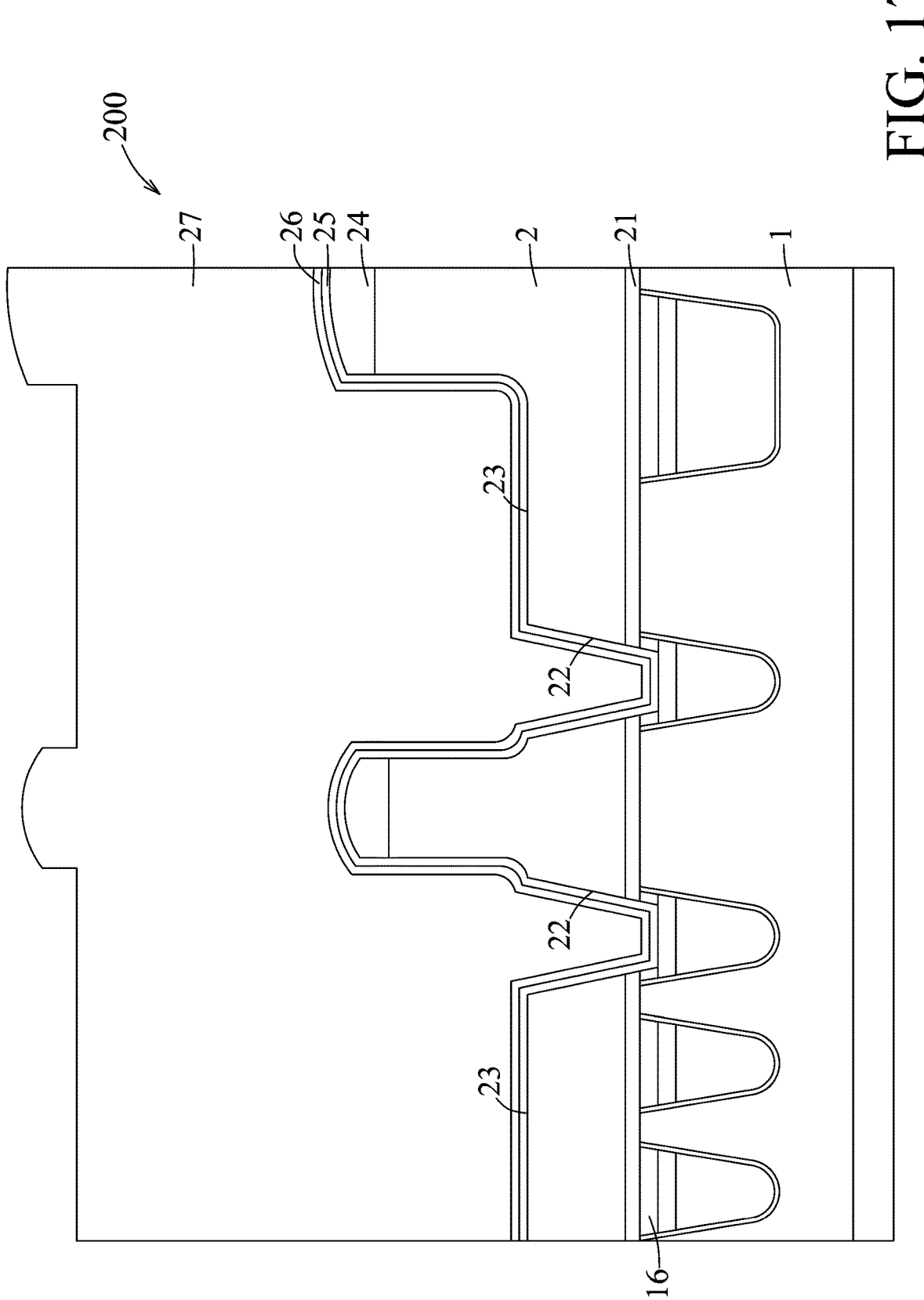
Figure 18:
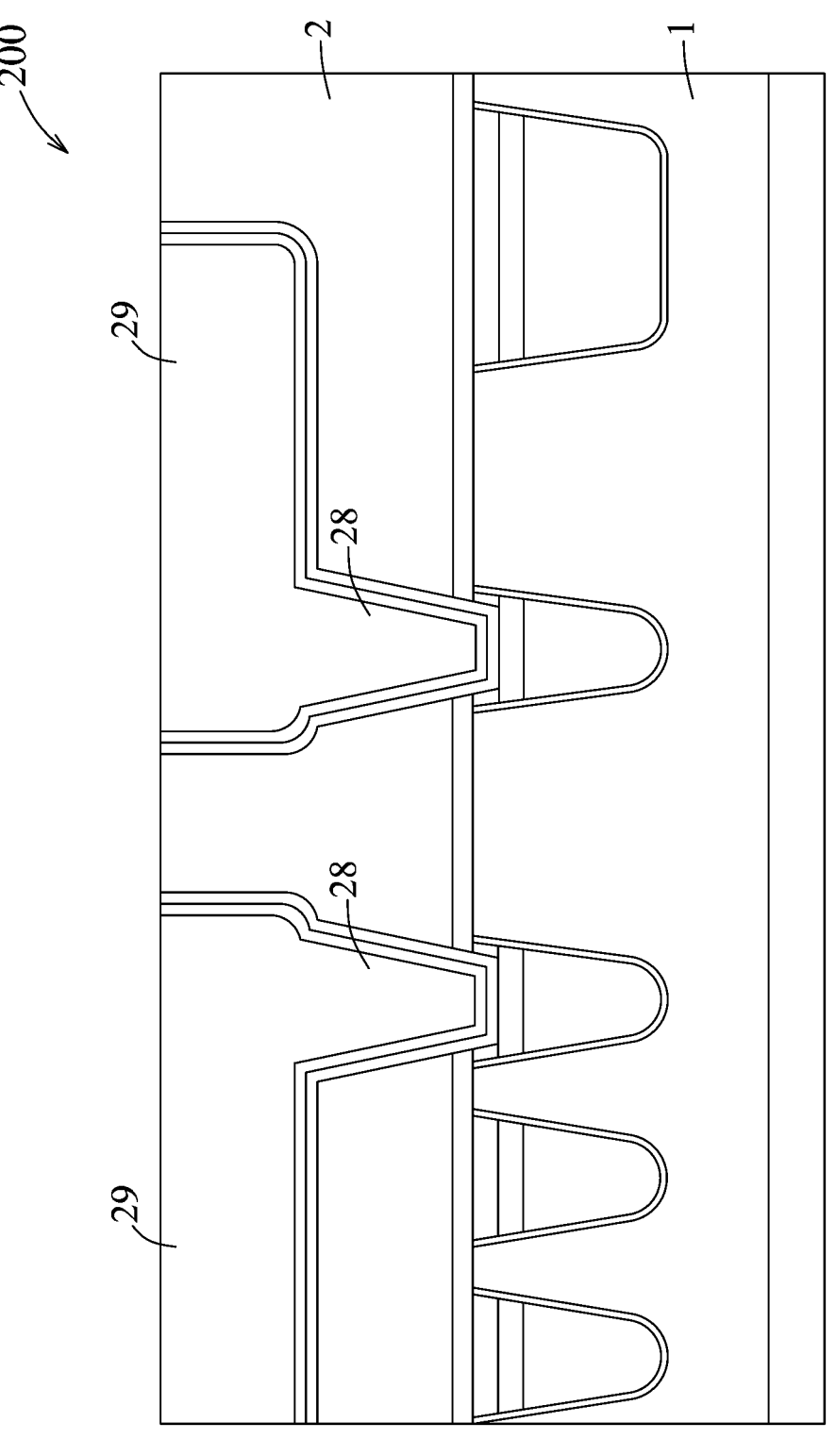

Referring to FIG. 1 and the example illustrated in FIGS. 11 to 18, in some alternative embodiments, step 104 of filling a first metal material into the recesses is implemented in such a manner that the first metal material 14 is deposited by using the PVD process, and substantially fills up all of the narrower first recesses 11 and the wider second recess 12. As a result, in the example of FIG. 11, the second recess 12 is substantially filled with the first metal material 14, and no empty space is available in a central region of the second recess 12, in contrast with the example of FIG. 3 where the first metal material 14 is conformally formed on lateral and bottom sides of the second recess 12. In subsequent step 106 where a second metal material is formed on the first metal material, since the second recess 12 is substantially filled with the first metal material 14, only a marginal portion of the second metal material 15 fills into the second recess 12. As a result, in the example of FIG. 12, the second metal material 15 is deposited over the recesses 11, 12 without a hybrid metal structure formed in the second recess 12, in contrast with the example of FIG. 4 where a hybrid metal structure including the first and second metal materials 14, 15 is provided in the second recess 12. In subsequent step 108 where a planarization treatment (e.g., CMP) is performed to remove the second metal material, the second metal material 15 and a portion of the first metal material 14 are removed from the top surface of the interconnect layer 1, and none of the second metal material 15 exists in the second recess 12 as shown in the example of FIG. 13, in contrast with the example of FIG. 5 where the hybrid metal structure remains in the second recess 12. In subsequent step 110 where another planarization treatment (e.g., CMP) is performed to planarize the metal oxide, the metal oxide layer 16 is formed and the top surface of the semiconductor device 200 is buffed, and the barrier metal layer 17 is formed under the metal oxide layer 16. The barrier metal layer 17 and the first metal material 14 formed in each of the recesses (including the first and second recesses 11, 12) and covered by the metal oxide layer 16 serve as a metal line as shown in the example of FIG. 14. It is noted that the metal line in the second recess 12 does not include the hybrid metal structure. In some embodiments, a metal line without the hybrid metal structure may have an electrical resistance different from (for example, lower than) a metal line containing the hybrid metal structure. Details regarding the subsequent steps 112 to 118 which respectively correspond to FIGS. 15 to 18 are similar to the aforementioned descriptions provided with respect to FIGS. 7 to 10, and are thus omitted herein for the sake of brevity.

Figure 20:
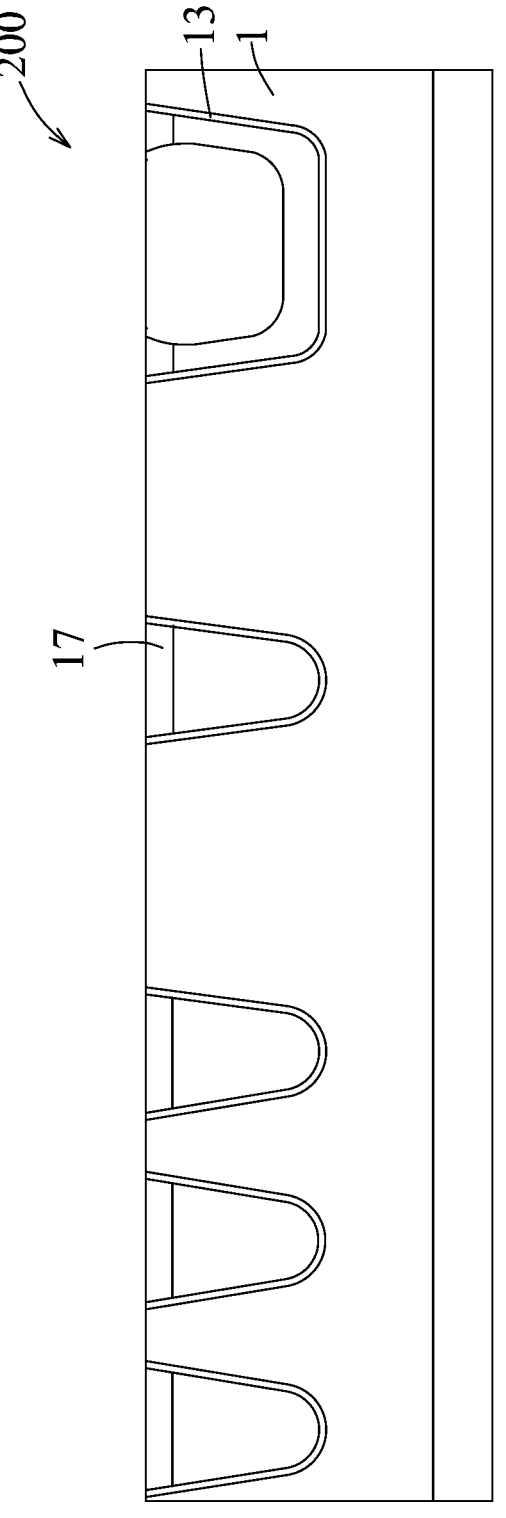
FIGS. 20 to 24 are schematic views illustrating some intermediate stages of a manufacturing method in accordance with some embodiments.

Referring to FIG. 19, the method 100 for manufacturing a semiconductor device in accordance with another embodiment further includes, subsequent to step 110 and prior to step 112, an additional step 111, where an additional planarization treatment (e.g., CMP) is performed to remove the metal oxide layer formed in step 110. In the example of FIG. 20, a third CMP process is performed to remove the metal oxide layer 16 (see FIG. 6) and excess of the interconnect layer 1 over a top surface of the barrier metal layer 17. The third CMP process is performed using a third CMP slurry which enables substantially the same removal rate selectivity of the metal oxide layer 16 and the interconnect layer 1, which is substantially higher than the removal rate selectivity of the barrier metal layer 17. The third CMP process thus stops upon reaching the barrier metal layer 17. In some embodiments, the third CMP slurry includes an abrasive, a surfactant and a metal corrosion inhibitor, but does not include an oxidizing agent. In other words, the third CMP slurry is an oxidant-free CMP slurry. The abrasive mechanically polishes the metal oxide layer 16, the barrier layer 13 and the interconnect layer 1, so that the metal oxide layer 16 can be removed by mechanical abrasion. Examples of abrasive include, but are not limited to, colloidal silica ($SiO_2$) or other suitable materials. A mass percentage of the abrasive and the third CMP slurry ranges from about 0.5% to about 2%. In some embodiments, the third CMP slurry may include a buffer, and the buffer may be used to maintain a pH level of the third CMP slurry in a range from about 6 to about 8. Other parameters related to the abrasive, the surfactant, the corrosion inhibitor and the buffer contained in the third CMP slurry may be similar to those of the first CMP slurry, and details thereof are omitted for the sake of brevity.

The third CMP slurry is applied to the polishing pad disposed on the platen or is directly dispensed onto a surface to be polished. Polishing parameters such as down force, slurry flow rate, table speed, head speed, and pad type may be adjusted to effect the results of the third CMP process. In some embodiments, the down force is in a range from about 0.5 psi to about 1.75 psi, the table speed (i.e., a rotational speed of the polishing pad) is in a range from about 30 to about 90 rpm, and the head speed (i.e., a rotational speed of a carrier for holding a wafer) is in a range of from about 20 rpm to about 85 rpm.

FIGS. 21 to 24 are schematic views of the semiconductor device 200 in accordance with some embodiments at some intermediate stages of the method 100 depicted in FIG. 19 for manufacturing a semiconductor device, and respectively correspond to steps 112 to 118 of the method 100.

Figure 21:
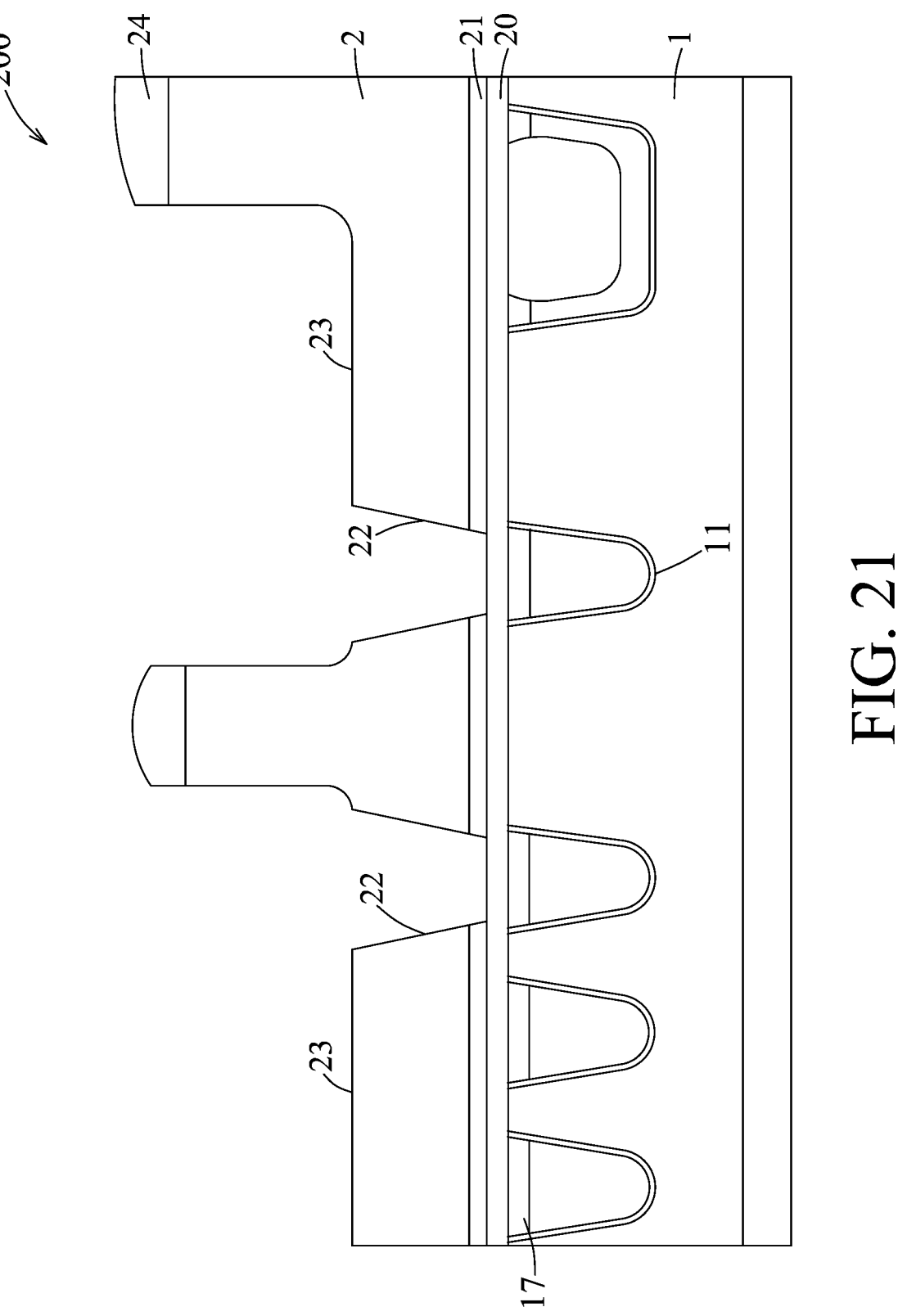

Referring to FIG. 19 and the example illustrated in FIG. 21, following step 111, the method 100 then proceeds to step 112, where at least one trench and at least one via opening are formed in a dielectric layer which is disposed over the interconnect layer. In the example shown in FIG. 21, a metal-containing etch stop layer 20, a non-metallic etch stop layer 21 and a dielectric layer 2 are sequentially formed on the interconnect layer 1 and the barrier metal layer 17, and then a plurality of via openings and a plurality of trenches (e.g., two via openings 22 and two trenches 23) are formed by patterning the dielectric layer 2 and the non-metallic etch stop layer 21 using one or more etching processes (for example, but not limited to, a dry etching process, a wet etching process, or a combination thereof) through a pattern of openings formed in a patterned mask layer 24 so as to expose portions of the metal-containing etch stop layer 20 through the via openings 22 and the trenches 23 connected to the via openings 22. In some embodiments, the non-metallic etch stop layer 21 may have a thickness ranging from about 10 Å to about 100 Å, and may include SiC, SiCN, ODC, carbon doped silicon oxide (SiOC), other dielectric materials or other suitable materials. It is noted that since the metal oxide layer 16 is removed in step 111, the metal-containing etch stop layer 20 is needed to serve as an etch stop layer for etching optimization during said one or more etching processes using a halide based (e.g., fluorine based) etching gas. In some embodiments, the metal-containing etch stop layer 20 may have a thickness ranging from about 10 Å to about 100 Å, and may include $AlO_x$, aluminum oxynitride (AlON), WN, $W_3N_2$, tungsten carbide (WC), other metal oxides, other dielectric materials or other suitable materials. Details regarding formation of the metal-containing etch stop layer 20 and the non-metallic etch stop layer 21, and etching of the dielectric layer 2 are similar to the descriptions provided with respect to FIG. 7, and are thus omitted herein for the sake of brevity.

Figure 22:
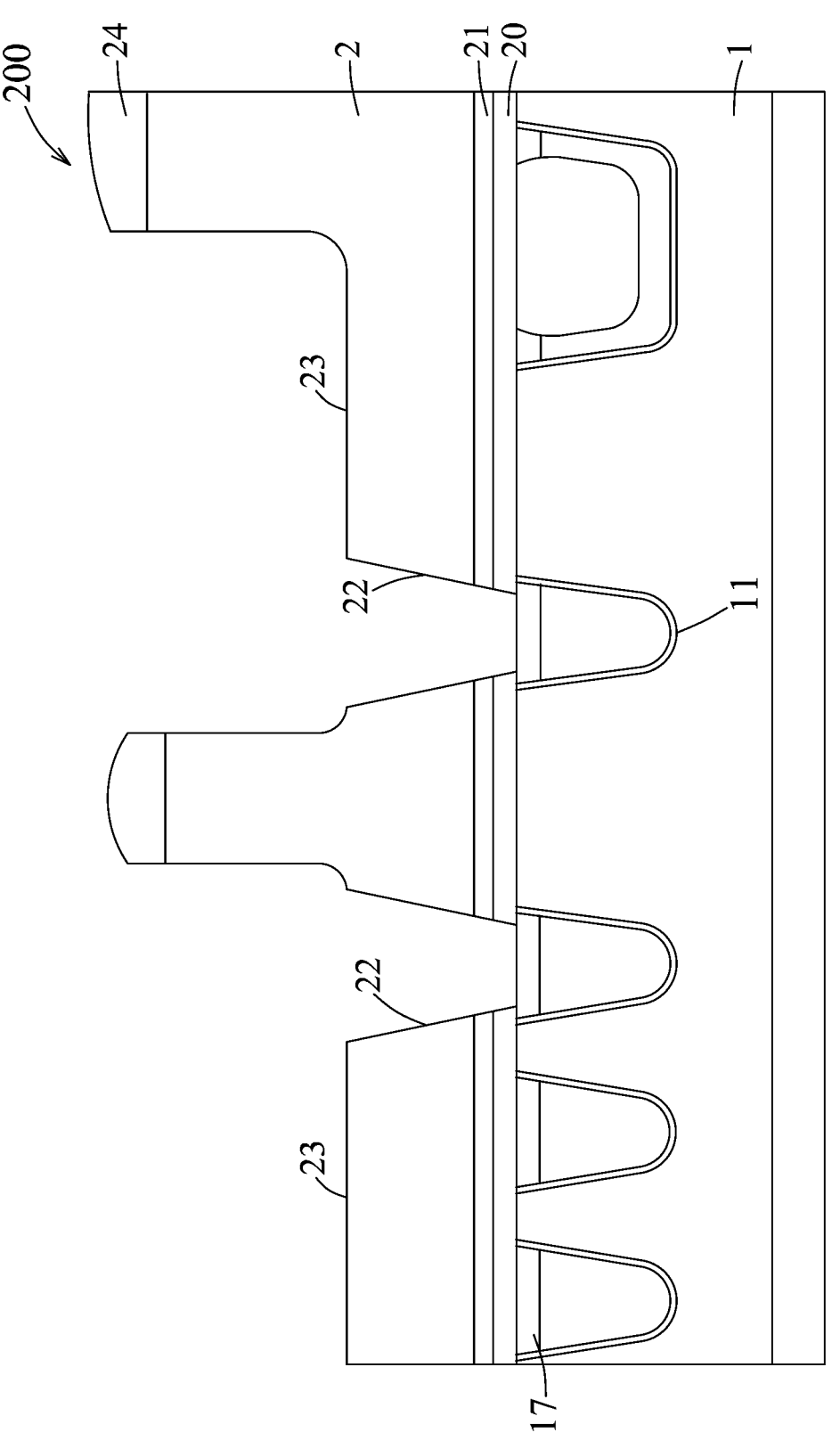

Referring to FIG. 19 and the example illustrated in FIG. 22, the method 100 then proceeds to step 114, where a portion of the metal-containing etch stop layer exposed through the at least one via opening and the at least trench is removed. In the example shown in FIG. 22, the portions of the metal-containing etch stop layer 20 which are exposed through the via openings 22 and the trenches 23 are removed by using a wet cleaning process, so that portions of the barrier metal layer 17 which were previously covered by the portions of the metal-containing etch stop layer 20 are exposed through the via openings 22 and the trenches 23. Details regarding etching of the portions of the metal-containing etch stop layer 20 are similar to those of the wet etching process used to removed the portions of the metal oxide layer 16 shown in FIG. 8. Parameters related to the portions of the barrier metal layer 17 are similar to the descriptions provided with respect to FIG. 8, and are thus omitted herein for the sake of brevity.

Figure 23:
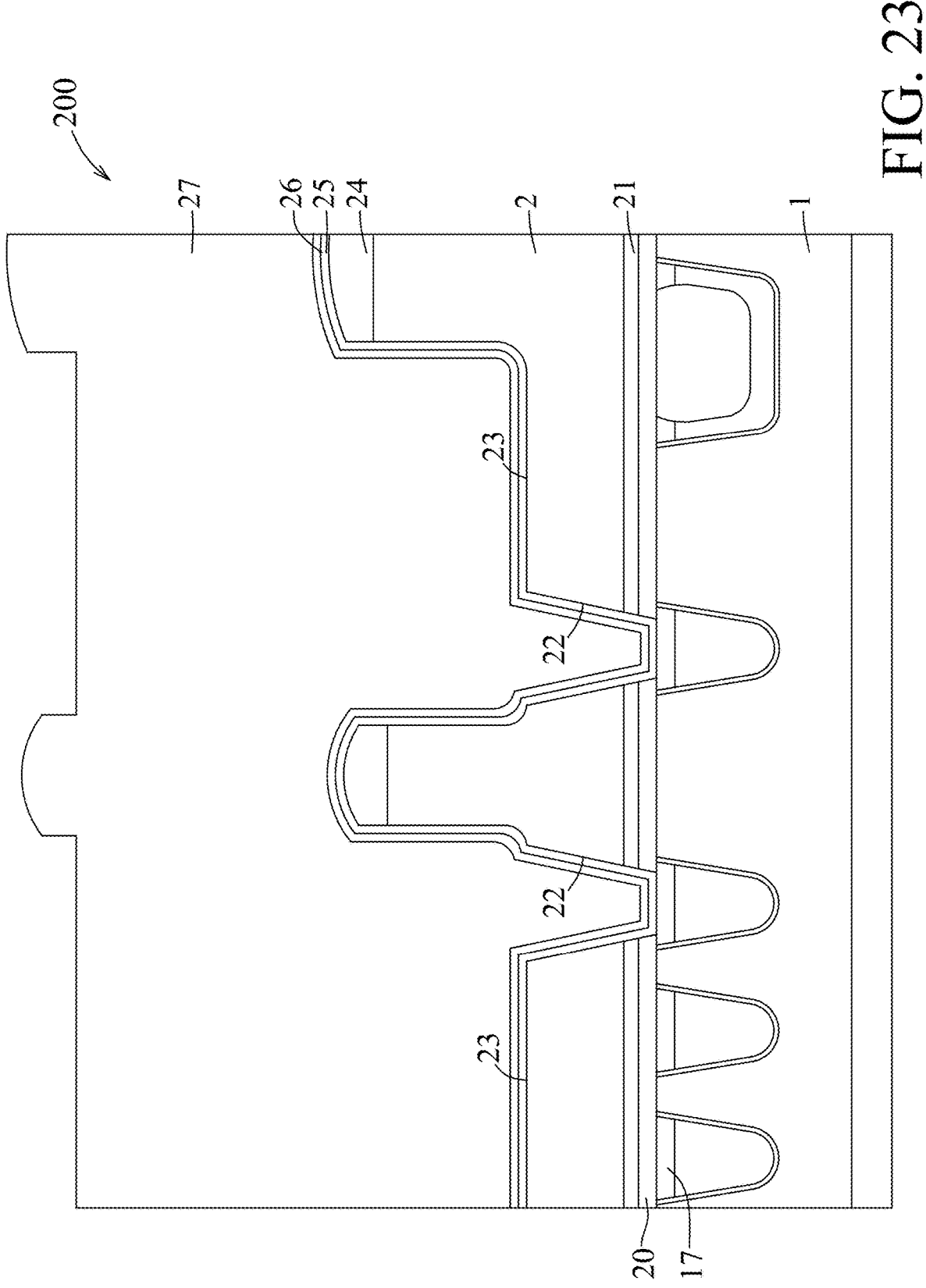
Figure 24:
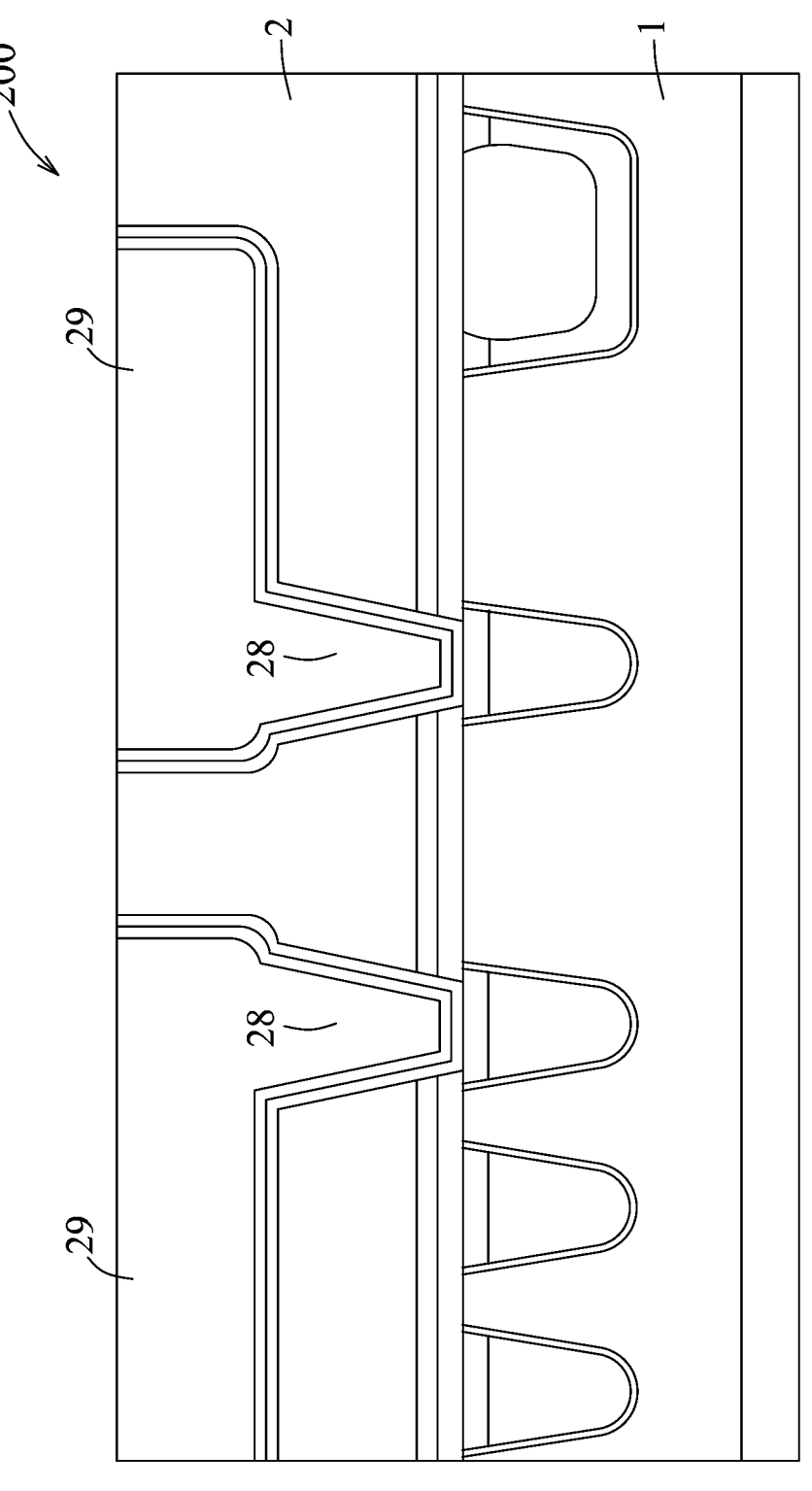

Details regarding the subsequent steps 116 and 118 of the method 100 in FIG. 19 which respectively correspond to FIGS. 23 and 24 are similar to the aforementioned descriptions provided with respect to FIGS. 9 and 10, and are thus omitted herein for the sake of brevity.

Figure 11:
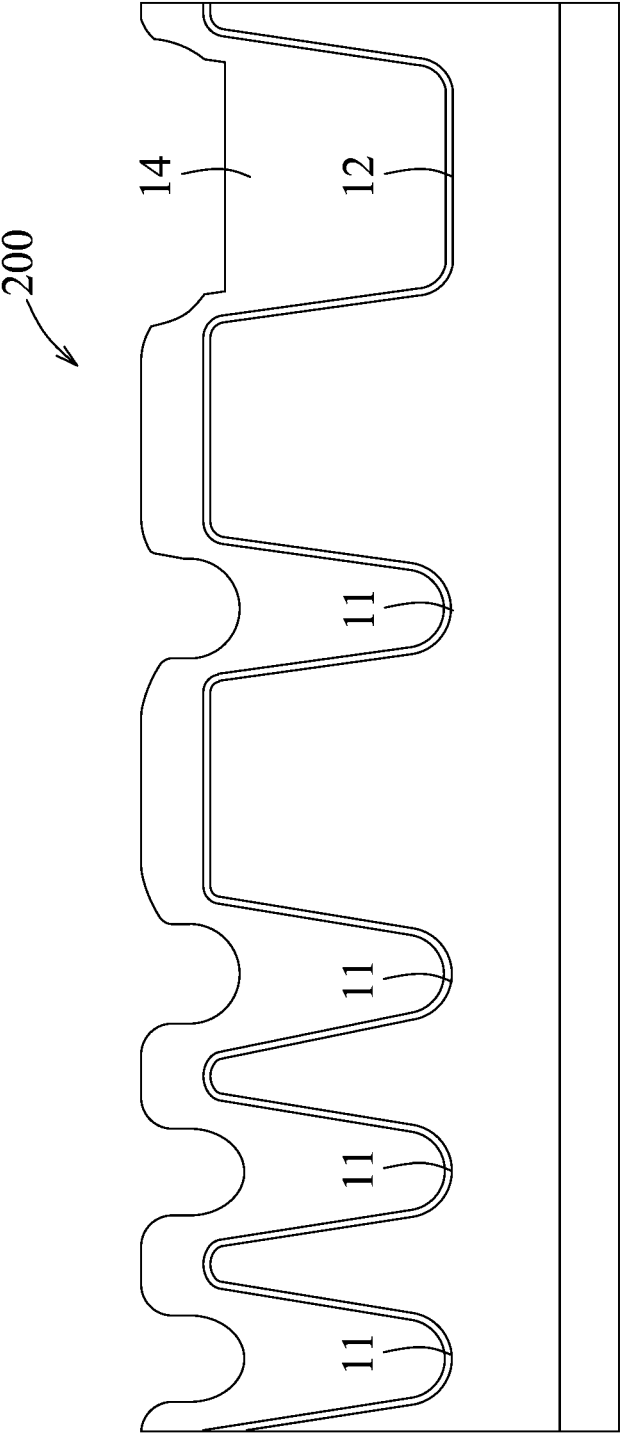
FIGS. 11 to 18 are schematics view illustrating some intermediate stages of a manufacturing method in accordance with some alternative embodiments.
Figure 12:
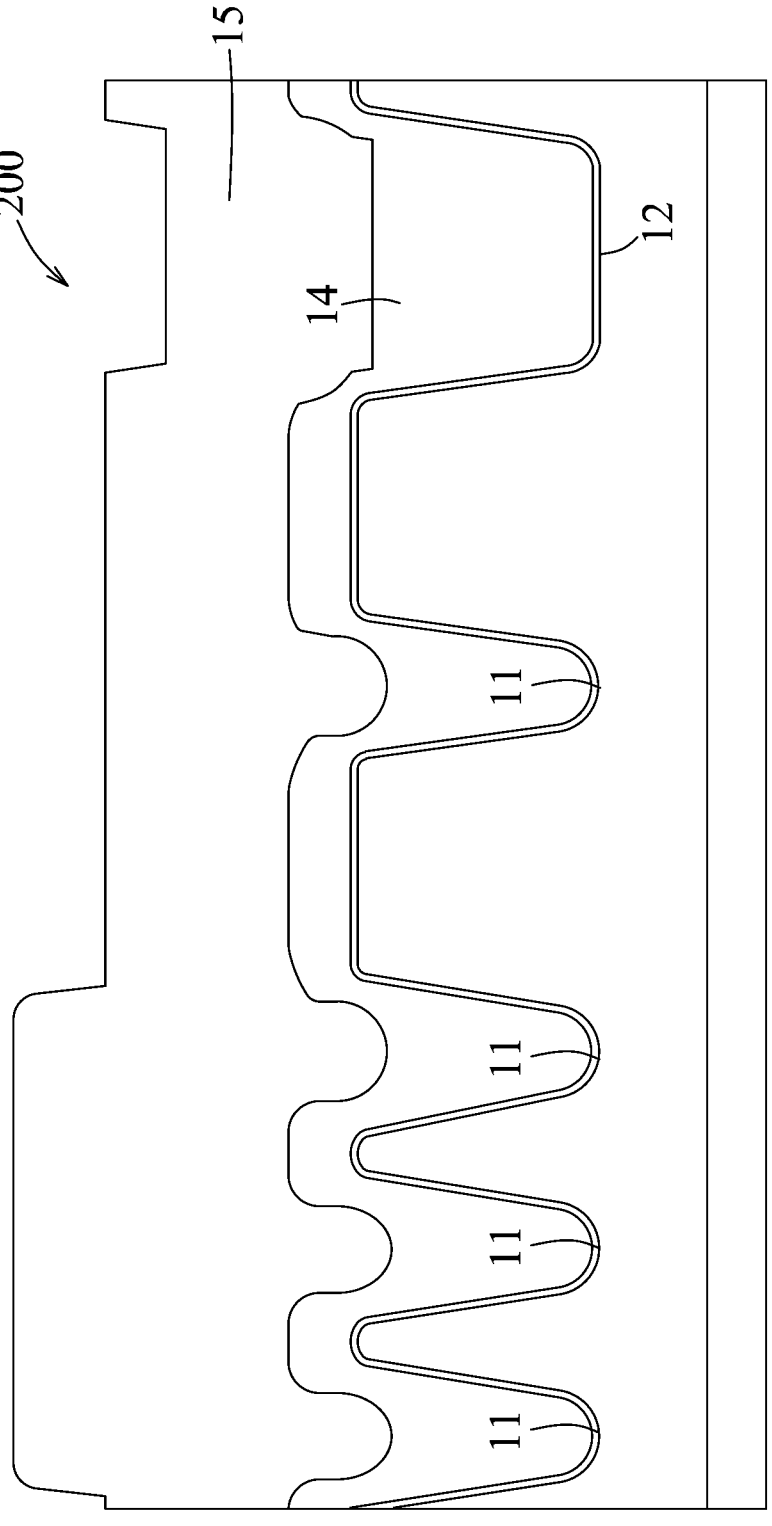
Figure 25:
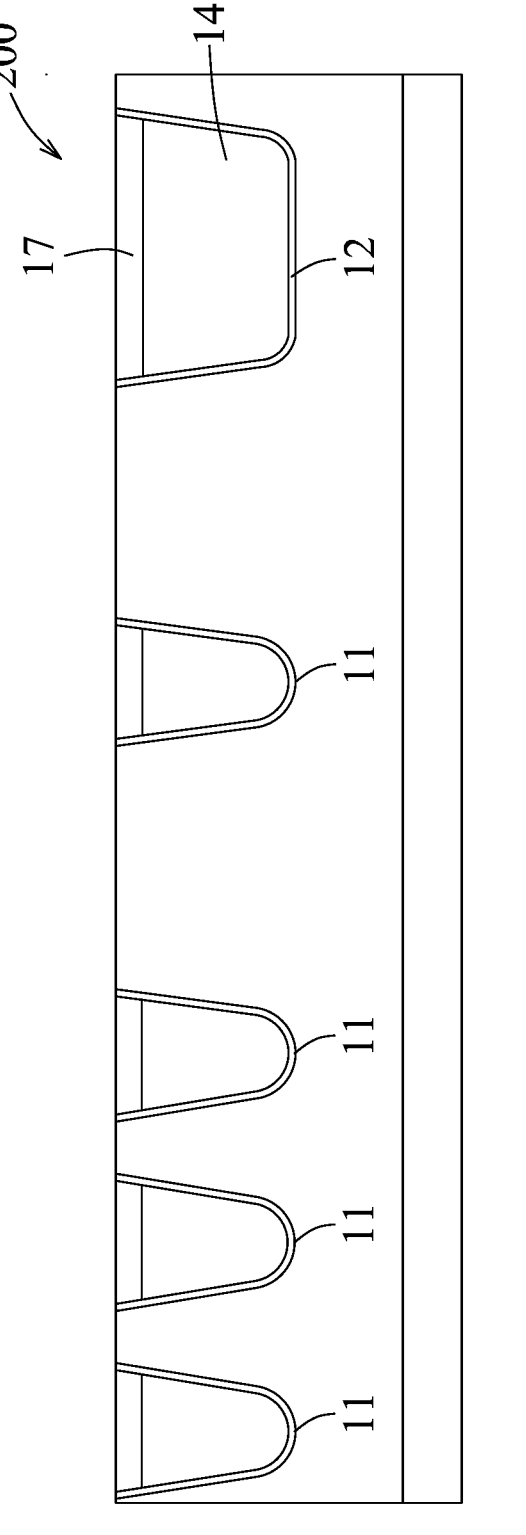
FIGS. 25 to 29 are schematic views illustrating some intermediate stages of a manufacturing method in accordance with some alternative embodiments.
Figure 26:
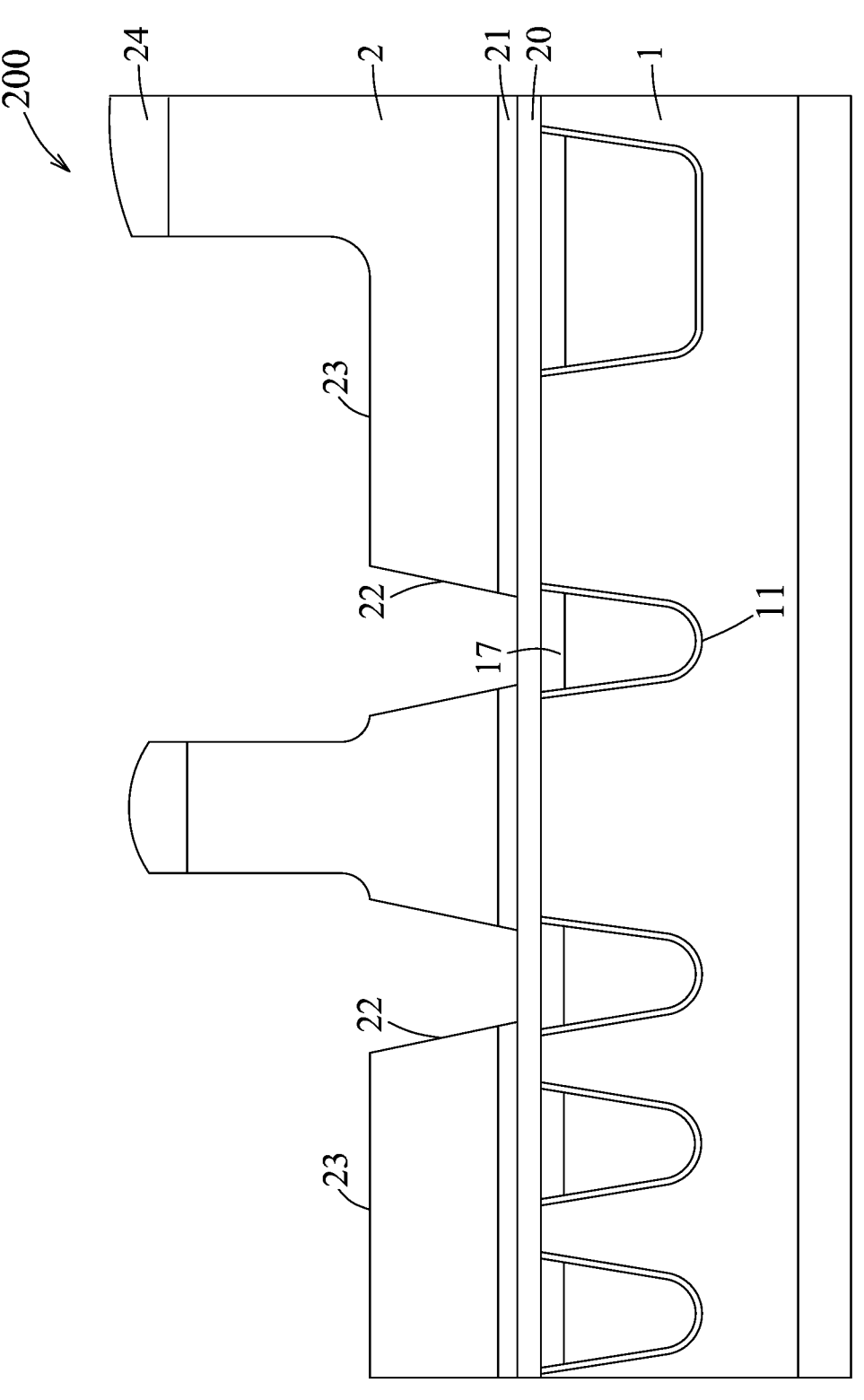
Figure 27:
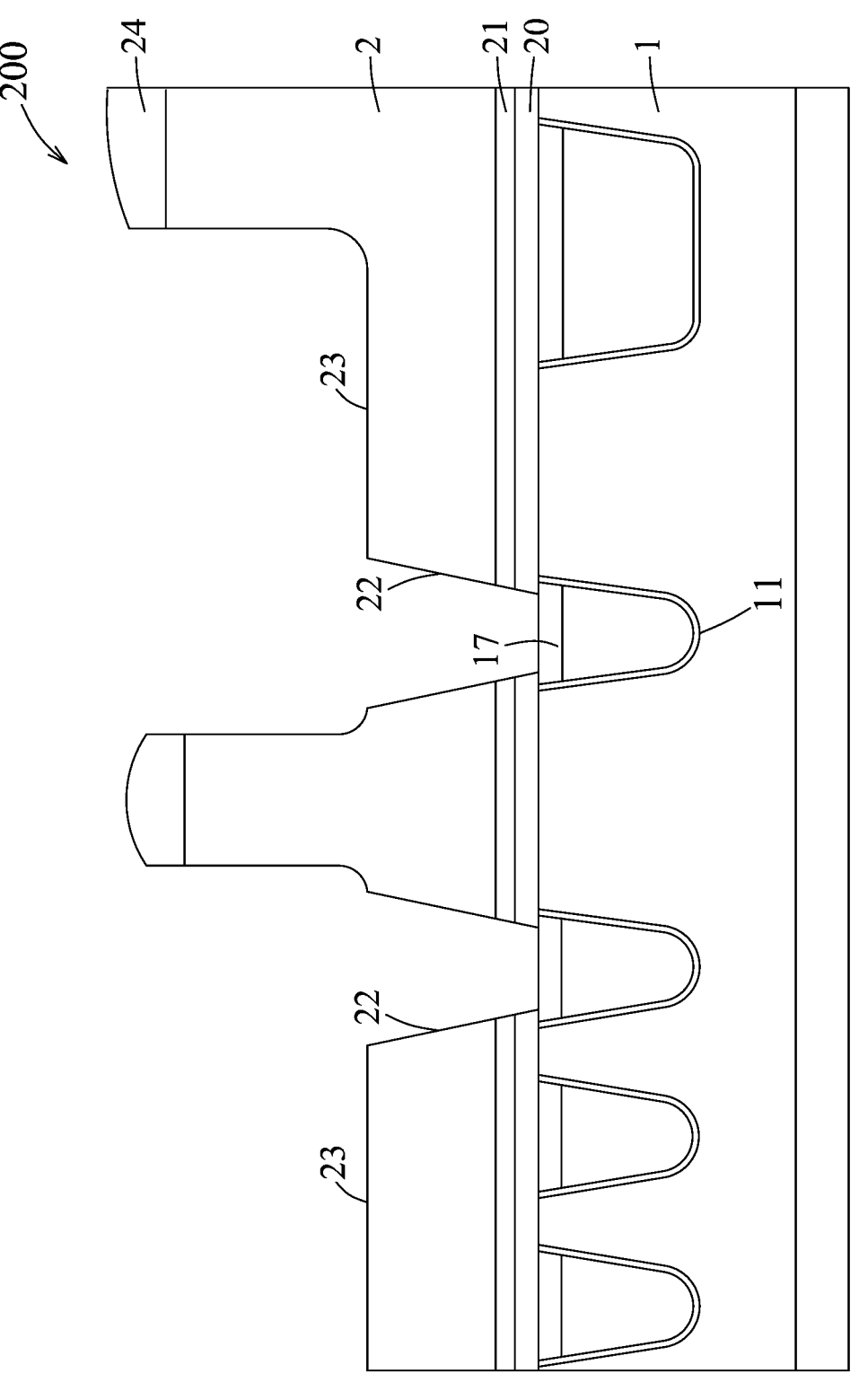
Figure 28:
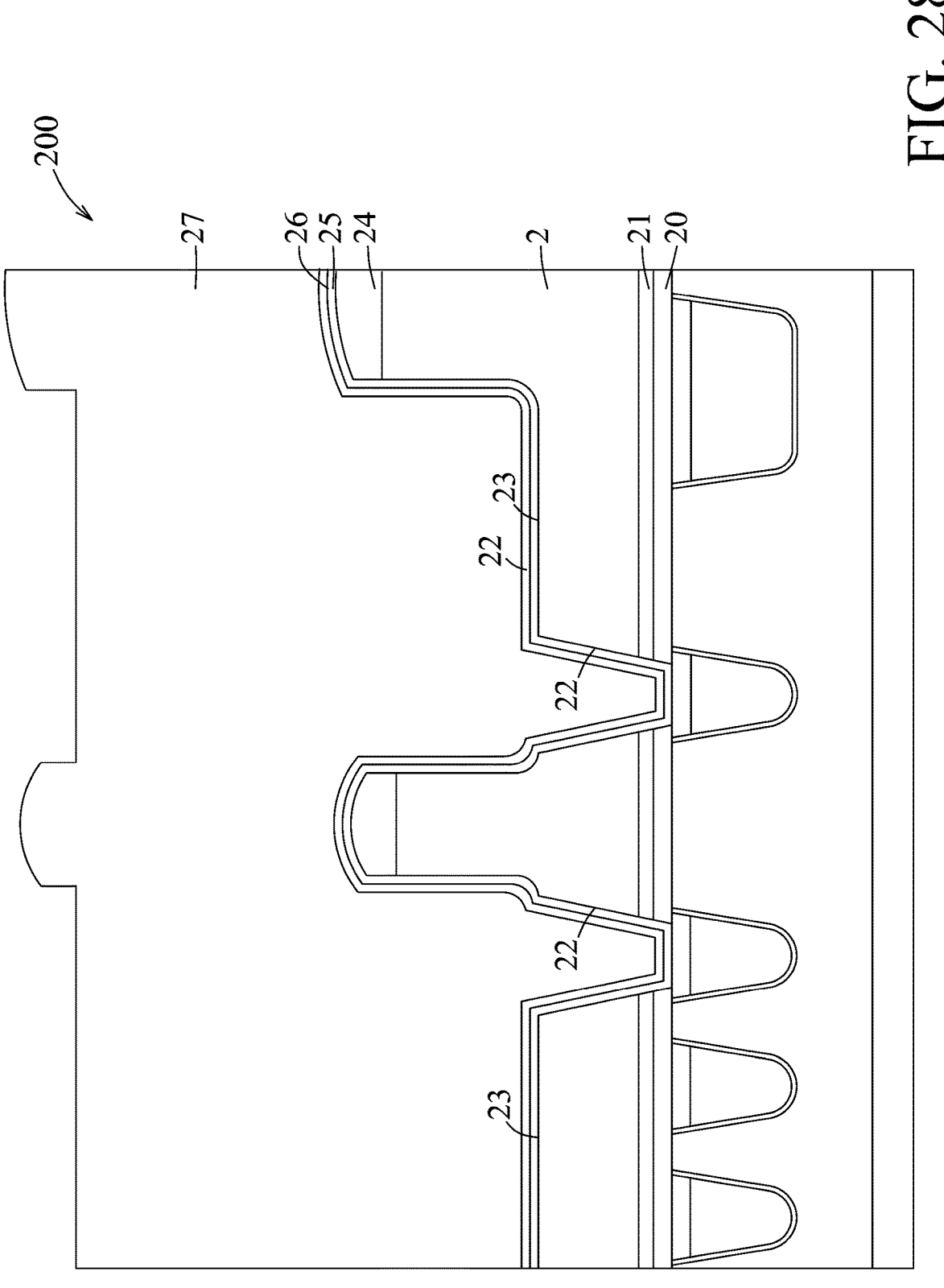
Figure 29:
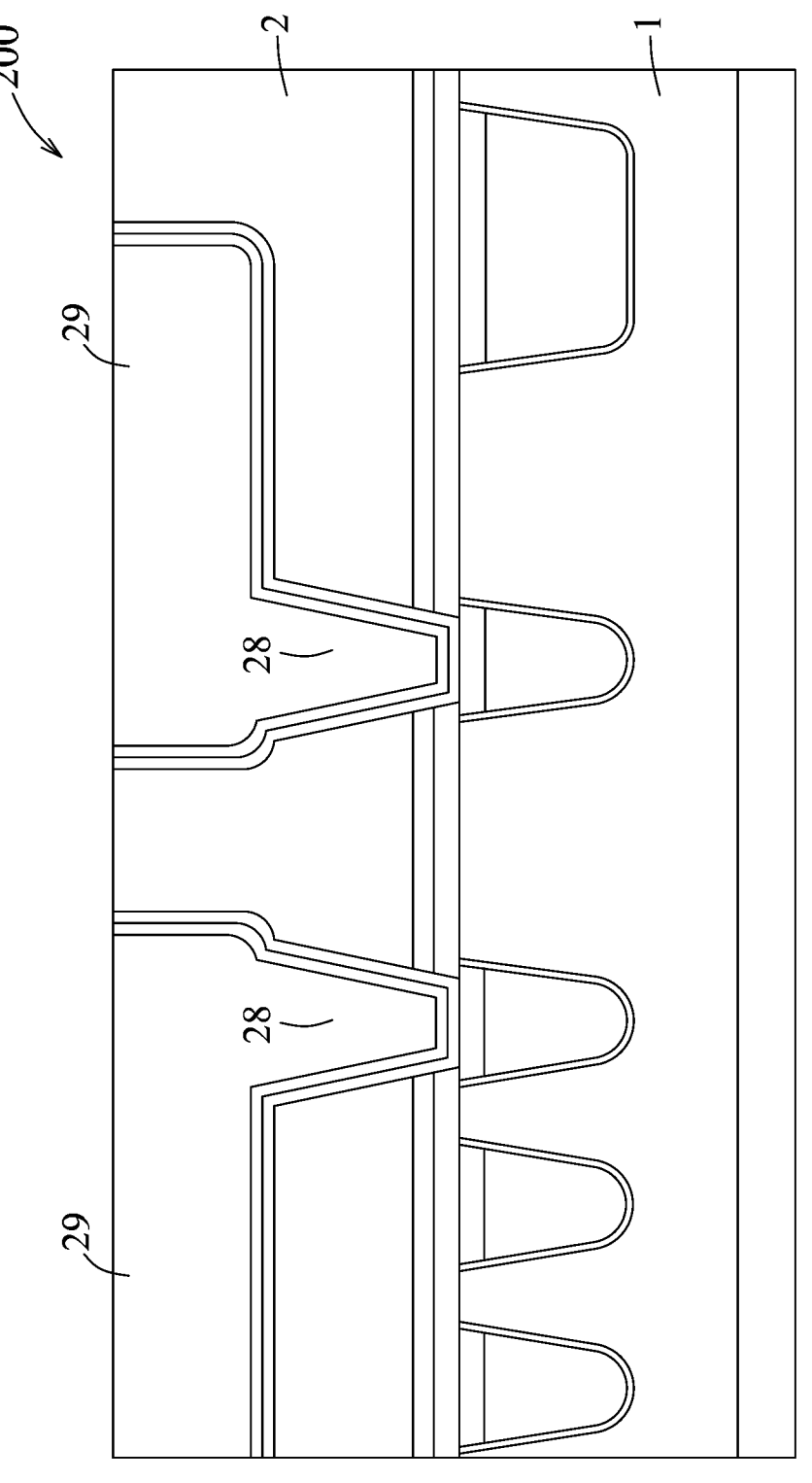

Referring to FIG. 19, in some alternative embodiments where step 104 of filling a first metal material into the recesses is implemented in such a manner that the first metal material 14 is deposited by using the PVD process, and substantially fills up all of the narrower first recesses 11 and the wider second recess 12 as exemplarily shown in FIG. 11, the method 100 further includes, subsequent to step 110 of planarizing the metal oxide to form the metal oxide layer 16 as exemplarily shown in FIG. 14, an additional step 111, where an additional planarization treatment (e.g., CMP) is performed to remove the metal oxide layer 16. As a result, in the example of FIG. 25, for each of the recesses (including the first recesses 11 and the second recess 12), the first metal material 14 occupies most of the recess and is located at a lower portion of the recess while the barrier metal layer 17 is located at an upper portion of the recess to cover the first metal material 14. Since the metal oxide layer 16 has been removed, each of the metal lines including the first metal material 14 and the barrier metal layer 17 is exposed. It is noted that the metal line in the second recess 12 does not include the hybrid metal structure. Details regarding the third CMP process for removing the metal oxide layer 16 is similar to the aforementioned descriptions provided with respect to FIG. 20, and are thus omitted herein for the sake of brevity.

Details regarding the subsequent steps 112 to 118 of the method 100 in FIG. 19 which respectively correspond to FIGS. 26 to 29 are similar to the aforementioned descriptions provided with respect to FIGS. 21, 22, 9 and 10, respectively, and are thus omitted herein for the sake of brevity.

In some embodiments, a self-formed metal oxide etch stop layer may be employed in a single damascene process when forming a via contact. FIG. 30 illustrates a method 300 for manufacturing a semiconductor device in accordance with some embodiments. FIGS. 31 to 36 are schematic views of a semiconductor device 400 in accordance with some embodiments at some intermediate stages of the method 300 depicted in FIG. 30 for manufacturing a semiconductor device. Additional steps can be provided before, after or during the method 300, and some of the steps described herein may be replaced by other steps or be eliminated. Similarly, further additional features may be present in the semiconductor device 400, and/or features present may be replaced or eliminated in additional embodiments.

Figure 31:
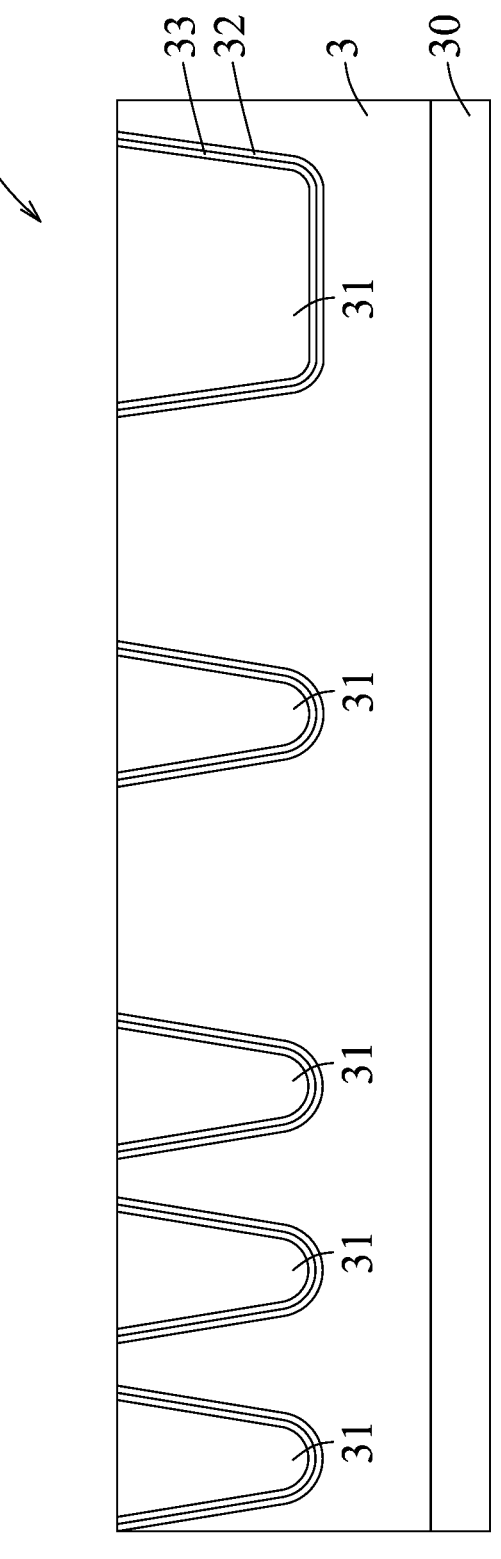
FIGS. 31 to 36 are schematic views illustrating some intermediate stages of a manufacturing method in accordance with some embodiments.

Referring to FIG. 30 and the example illustrated in FIG. 31, the method 100 begins at step 302, where at least one metal line is formed in an interconnect layer. In the example of FIG. 31, a plurality of metal lines (five metal lines 31 are exemplarily illustrated) are formed in an interconnect layer 3, and a metal barrier layer 32 and a metal liner layer 33 are provided between the metal lines 31 and the interconnect layer 3. Specifically, the interconnect layer 3 is first formed over a substrate 30. The formation and material of the interconnect layer 3 have been described beforehand in the paragraphs related to step 102 of the method 100 in FIGS. 1 and 2, and details thereof are omitted herein for the sake of brevity. A plurality of recesses are then formed in the interconnect layer 3 by using patterning operations including lithography and etching processes. Next, the metal barrier layer 32 and the metal liner layer 33 are sequentially formed on the interconnect layer 3 and in the recesses. Later, a metal material is filled into the recesses and deposited on the metal liner layer 33. A planarization treatment (e.g., CMP) is performed last to remove excess of the metal material so as to form the metal lines 31. Details regarding the formation and materials of the metal barrier layer 32, the metal liner layer 33 and the metal material are similar to the descriptions provided with respect to step 116 of the method 100 in FIGS. 1 and 9, and are thus omitted herein for the sake of brevity.

Figure 32:
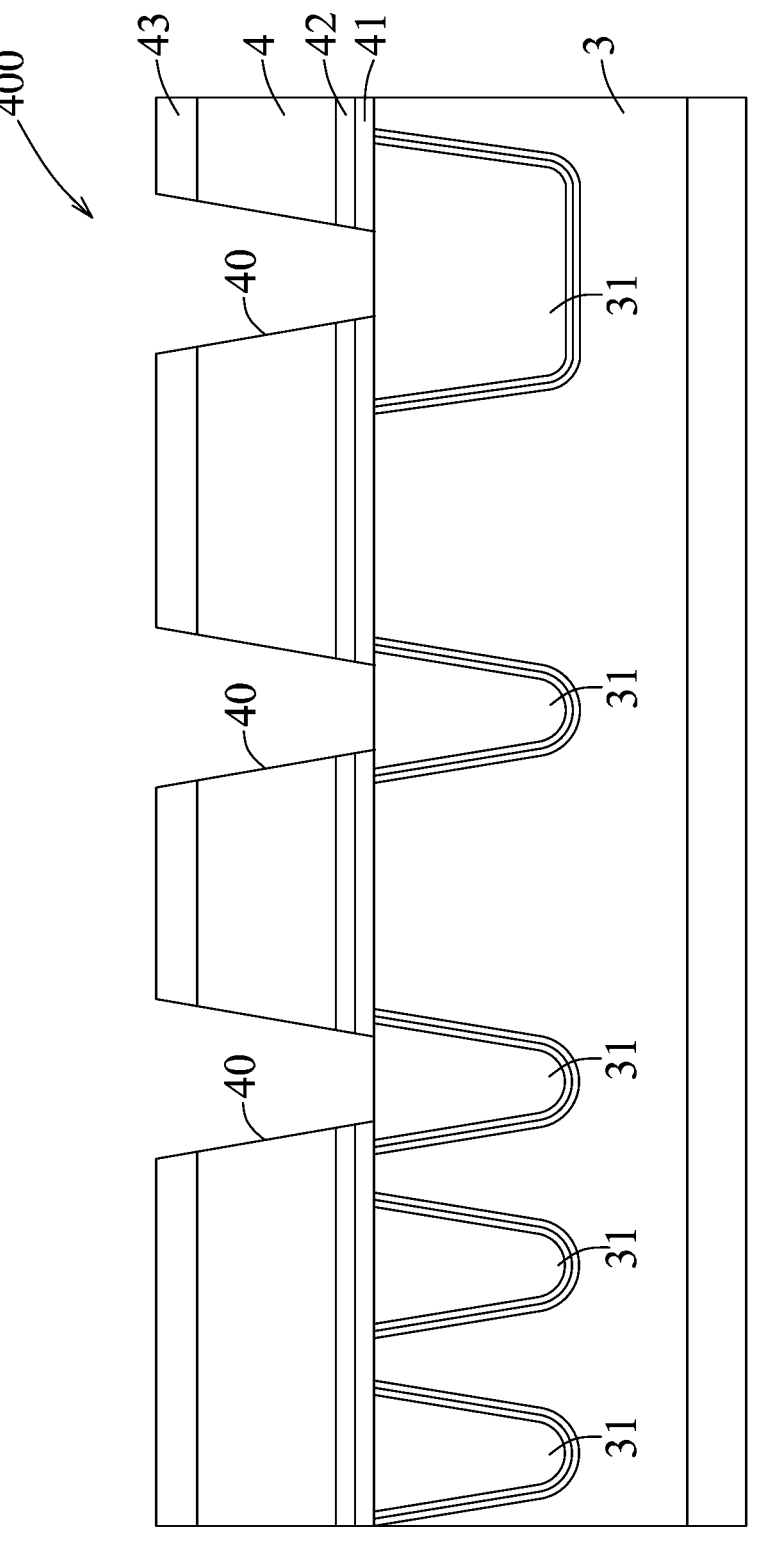

Referring to FIG. 30 and the example illustrated in FIG. 32, the method 300 proceeds to step 304, where at least one via opening is formed in a first dielectric layer which is disposed over the interconnect layer. In the example shown in FIG. 32, a first etch stop layer 41, a second etch stop layer 42 and a first dielectric layer 4 are sequentially formed on the interconnect layer 3 and the metal lines 31, and then a plurality of via openings (e.g., three via openings 40) are formed by patterning the first dielectric layer 4, the second etch stop layer 42 and the first etch stop layer 41 using one or more etching processes (for example, but not limited to, a dry etching process, a wet etching process, or a combination thereof) through a pattern of openings formed in a patterned mask layer 43 so as to expose portions of the metal lines 31 through the via openings 40. In some embodiments, the first etch stop layer 41 may be a metal-containing etch stop layer, and the second etch stop layer 42 may be a non-metallic etch stop layer. Details regarding the formation and materials of the metal-containing etch stop layer and the non-metallic etch stop layer are similar to the descriptions provided with respect to step 112 of the method 100 in FIGS. 19 and 26, and are thus omitted herein for the sake of brevity. In some embodiments, each of the via openings 40 has a depth which is in a range from about 50 Å to about 1000 Å, and has a critical dimension (e.g., a diameter of the via opening) which is in a range from about 5 nm to about 30 nm.

Figure 33:
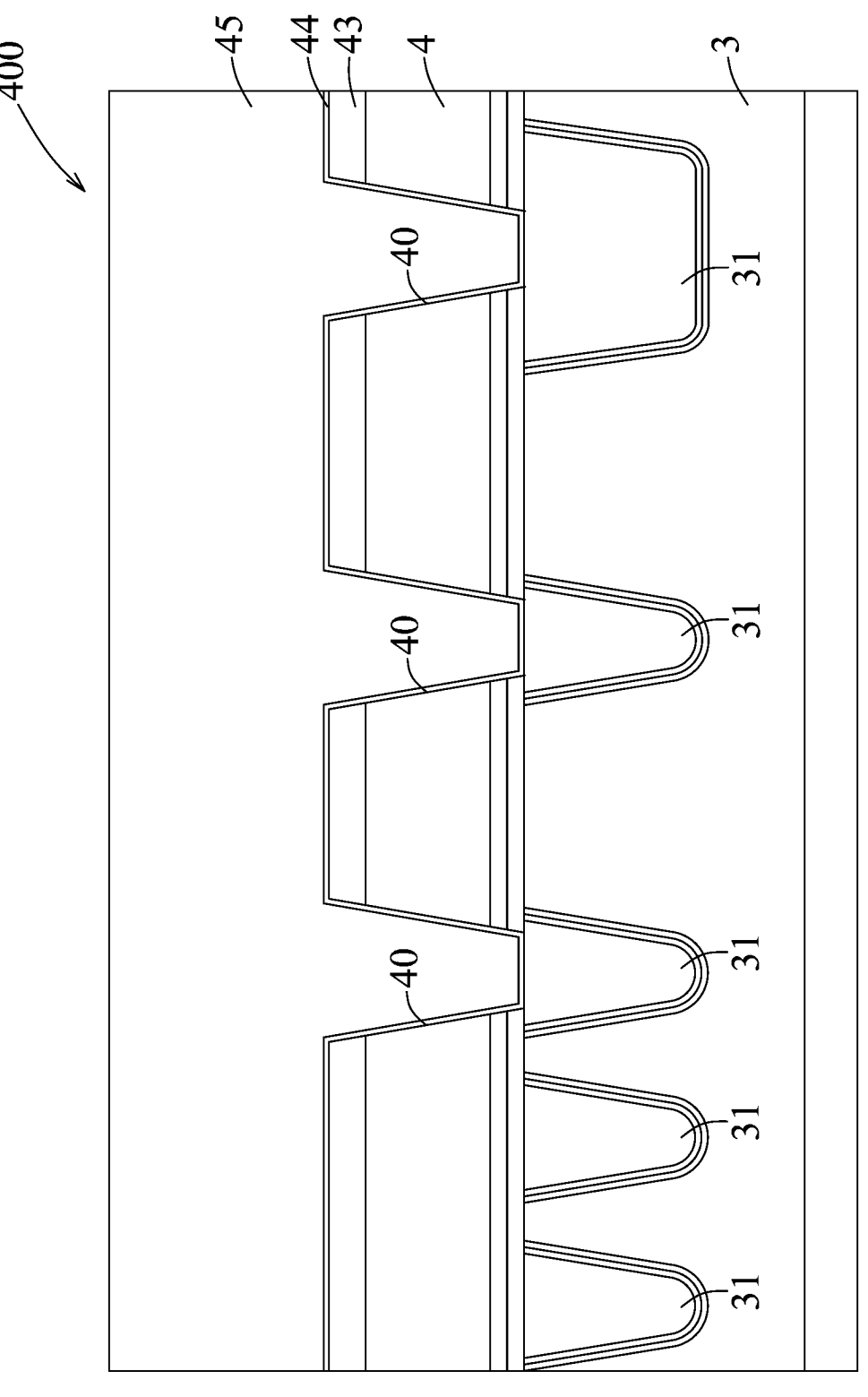

Referring to FIG. 30 and the example illustrated in FIG. 33, the method 300 proceeds to step 306, where a barrier layer is formed over the first dielectric layer and in the at least one via opening, and a first metal material is then filled into the at least one via opening. A barrier layer 44 is deposited on the patterned mask layer 43 and in the recesses 40 to cover the first dielectric layer 4 and the portions of the metal lines 31 exposed through the via openings 40 by using CVD, PVD, ALD or electro-plating such as electrodeless plating. The barrier layer 44 has a thickness ranging from about 10 Å to about 300 Å. In some embodiments, the barrier layer 44 may include, for example, but not limited to, transition metal nitride, such as TaN, TiN, WN or ZrN, WC or other suitable materials.

Subsequently, a first metal material 45 is filled into the via openings 40 and deposited on the barrier layer 44 by a suitable deposition process as is known to those skilled in the art of semiconductor fabrication, for example, CVD, PECVD, PVD, or the like. In some embodiments, an annealing process may be used during or subsequent to the deposition process, and may be performed at a temperature ranging from about 150° C. to about 1000° C. In some embodiments, a thickness of the first meal material 45 deposited over the patterned mask layer 43 (also known as via metal overburden) ranges from about 200 Å to about 1000 Å. In some embodiments, the first metal material 45 includes an alloy, which is a mixture of at least two metal elements and is presented as $A_xB_y$, where A is a relatively active metal element having a lower reduction potential, such as Al, Mn, Zr, Cr, etc., B is a relatively noble metal element having a higher reduction potential, such as Cu, Ru, Co, etc., x is an integer ranging from 1 to 5, and y is another integer ranging from 1 to 9.

Figure 34:
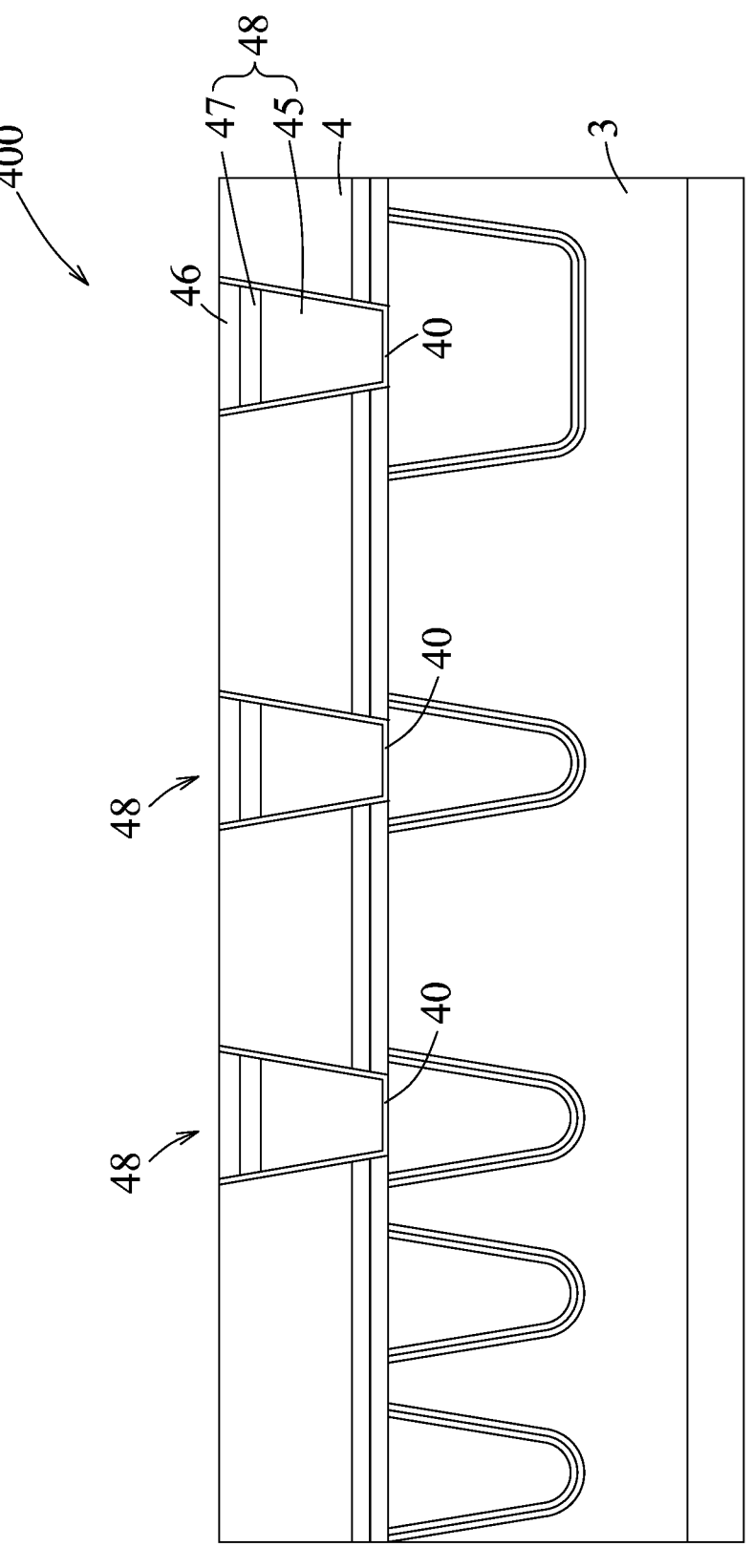

Referring to FIG. 30 and the example illustrated in FIG. 34, the method 300 proceeds to step 308, where a planarization treatment (e.g., a bulk CMP process) is performed to remove the first metal material, and another planarization treatment (e.g., a buffing CMP process) is performed to planarize a metal oxide. In the example of FIG. 34, a first CMP process is performed using a first CMP slurry to remove excess of the first metal material 45, the barrier layer 44 and the patterned mask layer 43 (see FIG. 33) over a top surface of the first dielectric layer 4. The first CMP slurry includes an oxidizing agent that is used to oxidize the relatively active metal element A in the first metal material 45 (i.e., the alloy $A_xB_y$) into its corresponding oxide. For example, in some embodiments, a metal oxide (e.g., $A_xO_z$, where x is an integer ranging from 1 to 5, and z is another integer ranging from 1 to 5) is formed, and a relatively high concentration of the relatively noble metal element B originally contained in the alloy is formed (referred to as a purer metal hereinafter) under the metal oxide. Details regarding the first CMP process and the first CMP slurry are similar to the descriptions provided with respect to step 108 of the method 100 in FIG. 1 and with reference to FIG. 5, and are thus omitted herein for the sake of brevity.

Following the first CMP process, a second CMP process is performed using a second CMP slurry to form a metal oxide layer 46 and buff the semiconductor device 400. The second CMP slurry includes an oxidizing agent that is used to oxidize the relatively active metal element A in the first metal material 45 (i.e., the alloy $A_xB_y$) into its corresponding oxide. In this way, the second CMP slurry induces more metal oxide $A_xO_z$ so as to form the metal oxide layer 46, and more of the purer metal is generated so as to form a barrier metal layer 47 (i.e., a self-formed barrier metal layer) under the metal oxide layer 46. In some embodiments, the metal oxide layer 46 may have a thickness ranging from about 20 Å to about 50 Å. In some embodiments, the metal oxide layer 46 may have a thickness ranging from about 22 Å to about 45 Å. In this way, the metal oxide layer 46 may serve as a self-formed etch stop layer for an etching process in a later stage. The metal material 45 and the barrier metal layer 47 left in the via openings 40 cooperate to form a plurality of via contacts (three via contacts 48 being exemplarily illustrated) that are covered by the metal oxide layer 46. Details regarding the second CMP process and the second CMP slurry are similar to the descriptions provided with respect to step 110 of the method 100 in FIG. 1, making reference to FIG. 6, and are thus omitted herein for the sake of brevity.

Figure 35:
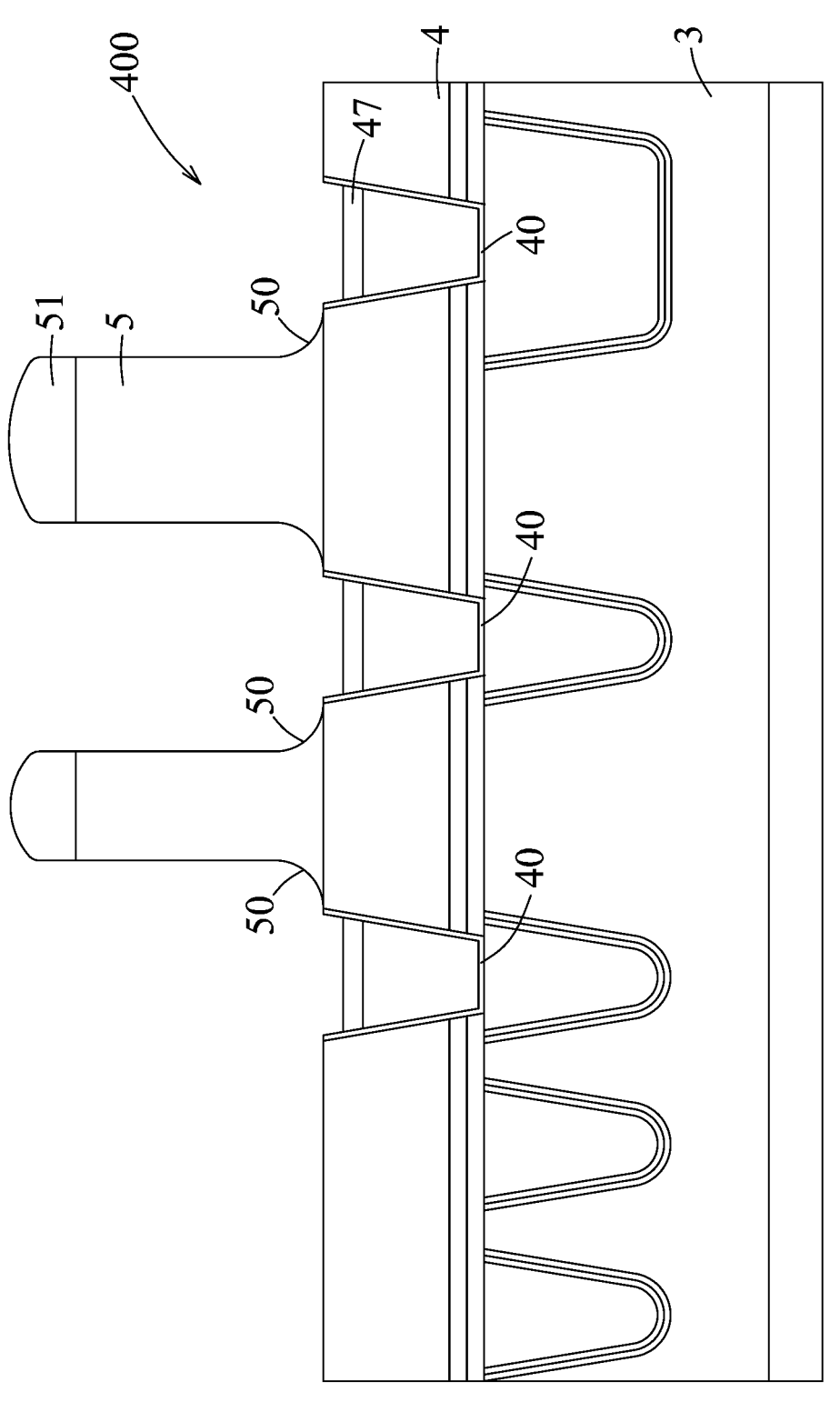

Referring to FIG. 30 and the example illustrated in FIG. 35, the method 300 proceeds to step 310, where at least one trench is formed in a second dielectric layer which is disposed over the first dielectric layer, and the metal oxide layer exposed through the at least one trench is then removed. In the example shown in FIG. 35, a second dielectric layer 5 is formed on the first dielectric layer 4 and the metal oxide layer 46 (see FIG. 34), and then a plurality of trenches (three trenches 50 being exemplarily illustrated) are formed by patterning the second dielectric layer 5 using one or more etching processes (for example, but not limited to, a dry etching process, a wet etching process, or a combination thereof) through a pattern of openings formed in a patterned mask layer 51 that corresponds in position to the via contacts 48 so as to expose the metal oxide layer 46 (see FIG. 34) through the trenches 50. In some embodiments, the second dielectric layer 5 is etched by a dry etching process using a halide based (e.g., fluorine based) etching gas, and the trenches 50 are recessed downwardly from a top surface of the second dielectric layer 5 to expose the first dielectric layer 4 and the metal oxide layer 46 formed in the via openings 40. It is noted that the metal oxide layer 46 is able to serve as an etch stop layer (e.g., a metal oxide etch stop layer) during said one or more etching processes for forming the trenches 50.

Following formation of the trenches, the metal oxide layer 46 which is exposed through the trenches 50 is removed by using a wet cleaning process, so that the barrier metal layer 47 which was previously covered by the metal oxide layer 46 is exposed through the via openings 40 and the trenches 50. In some embodiments, a top surface of the barrier metal layer 47 formed in the via openings 40 is recessed with respect to the top surface of the first dielectric layer 4 by a distance ranging from about 20 Å to about 50 Å. In some embodiments, for one of the trenches 50 and a corresponding one of the via openings 40, a sidewall that borders the trench 50 is indented with respect to a sidewall that borders the via opening 40 by a distance ranging from about 0 nm to about 10 nm. Details regarding removal of the metal oxide layer 46 are similar to the descriptions provided with respect to step 114 of the method 100 in FIG. 1 making reference to FIG. 8, and are thus omitted herein for the sake of brevity.

Figure 36:
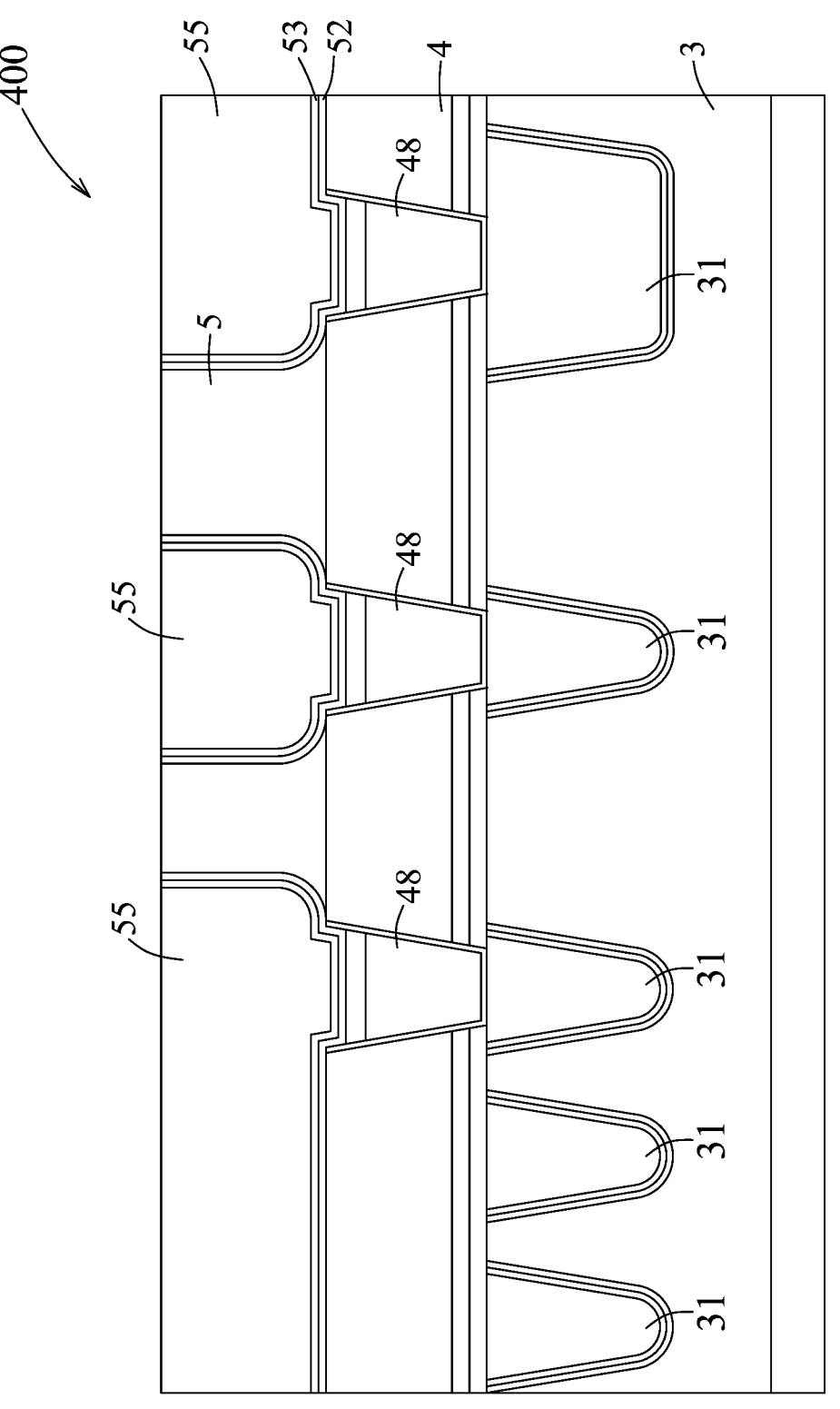

Referring to FIG. 30 and the example illustrated in FIG. 36, the method 300 proceeds to step 312, where a second metal material is filled into the at least one trench, and a planarization treatment (e.g., CMP) is performed to remove excess of the second metal material. In the example of FIG. 36, a metal barrier layer 52 and a metal liner layer 53 are sequentially formed in the trenches 50, and a second metal material is then filled into the trenches 50 and deposited on the metal liner layer 53. The second metal material is deposited by using electro chemical plating (ECP), PVD, or the like. Other suitable depositing techniques are within the contemplated scope of the disclosure. In some embodiments, the second metal material may include Cu, Co, Ru, or other suitable materials. Details regarding the formation and materials of the metal barrier layer 52 and the metal liner layer 53 are similar to the descriptions provided with respect to step 116 of the method 100 in FIG. 1 with reference to FIG. 9, and are thus omitted herein for the sake of brevity.

Following filling of the second metal material, a CMP process is performed to remove excess of the second metal material and the second dielectric layer 5, and the patterned mask layer 51 so as to form a plurality of conductive lines (three conductive lines 55 being exemplarily illustrated) in the second dielectric layer 5. The via contacts 48 are disposed in the first dielectric layer 4. The conductive lines 55 are disposed in the second dielectric layer 5, and are electrically connected, through the via contacts 48, to the portions of the metal lines 31 formed in the interconnect layer 3, respectively. In this way, a multilevel interconnect architecture which includes interconnect lines that are respectively formed in stacked layers and that are connected through via contacts from one layer to another layer can be realized. In some embodiments, each of the conductive lines 55 has a thickness ranging from about 300 Å to about 1000 Å, and has a critical dimension (e.g., a line width) ranging from about 10 nm to about 1 μm.

As a result, by means of using an alloy as a metal material to fill in the via openings and by means of using CMP slurries which include oxidizing agents to perform planarization treatments on the metal material and on a metal oxide induced from the metal material to form a metal oxide layer, the metal oxide layer thus formed may serve as a metal oxide etch stop layer during one or more etching processes for patterning a dielectric layer to form trenches therein. In this way, a step of depositing an etch stop layer may be omitted during two single damascene processes for forming an interconnect structure including via contacts and conductive lines.

In the semiconductor device of the present disclosure, alloys with relatively large mean free path, such as $Al_xRu_y$, $Al_xCu_y$, $Zr_xCu_y$, $Zr_xRu_y$, etc. (x is an integer ranging from 1 to 5, y is another integer ranging from 1 to 9), are used as materials for forming interconnect structures to reduce grain boundary scattering, and are thus able to substitute for the pure metal materials. In this scenario, during a CMP process, an alloy is oxidized by an oxidizing agent, such as $H_2O_2$, $H_5IO_6$, NaClO, etc., contained in the CMP slurry into metal oxide on a top surface of the alloy, and a relatively high concentration of metal of a certain thickness is formed under the metal oxide. Specifically, a constituent metal element of the metal oxide derives from a metal element of the alloy having a lower reduction potential, such as Al, Mn, Zr, Cr, etc., while the relatively high concentration of metal formed under the metal oxide derives from another metal element of the alloy having a higher reduction potential, such as Cu, Ru, Co, etc., so as to form a self-formed barrier metal layer. In some embodiments, the metal oxide may be removed by another CMP process with an oxidant-free CMP slurry. Alternatively, in some embodiments, the another CMP process may be omitted, and the metal oxide may be used as a self-formed metal oxide etch stop layer for a subsequent etching process. In this way, since an extra etch stop layer for etching optimization is not needed, cost and time of fabrication of semiconductor devices may be reduced. This technique can be used in existing damascene processes, including a dual damascene process and two or more single damascene processes.

In accordance with some embodiments of the present disclosure, a semiconductor device includes a substrate, an interconnect layer disposed over the substrate, a metal line formed in the interconnect layer, a dielectric layer disposed on the interconnect layer, and a via contact formed in the dielectric layer and electrically connected to the metal line. One of the via contact and the metal line includes a first metal material and a barrier metal layer disposed on the first metal material. The first metal material includes an alloy which is a mixture of two metal elements. The barrier metal layer includes one of the two metal elements.

In accordance with some embodiments of the present disclosure, the two metal elements of the alloy are a relatively active metal element having a lower reduction potential and a relatively noble metal element having a higher reduction potential. The barrier metal layer includes the relatively noble metal element of the alloy.

In accordance with some embodiments of the present disclosure, the alloy of the first metal material is presented as $A_xB_y$, where A is the relatively active metal element, B is the relatively noble metal element, x is an integer ranging from 1 to 5, and y is another integer ranging from 1 to 9.

In accordance with some embodiments of the present disclosure, the relatively active metal element includes one of aluminum, manganese, zirconium and chromium.

In accordance with some embodiments of the present disclosure, the relatively noble metal element includes one of copper, ruthenium and cobalt.

In accordance with some embodiments of the present disclosure, the semiconductor device further includes another metal line which is formed in the interconnect layer and which includes a first metal material and a barrier metal layer disposed on the first metal material, and a metal oxide layer which is formed in the interconnect layer and which covers the another metal line. The first metal material of the another metal line is the same as the first metal material of the one of the via contact and the metal line. Materials of the barrier metal layer of the another metal line and the barrier metal layer of the one of the via contact and the metal line are the same In accordance with some embodiments of the present disclosure, the metal oxide layer contains the relatively active metal element of the alloy.

In accordance with some embodiments of the present disclosure, the metal oxide layer has a thickness ranging from about 20 angstroms (Å) to about 50 Å.

In accordance with some embodiments of the present disclosure, the semiconductor device further includes another metal line which is formed in the interconnect layer and which includes a hybrid metal structure. The hybrid metal structure includes a first metal material that is located at lateral and bottom regions of the hybrid metal structure and a second metal material that is located at a central region of the hybrid metal structure. The first metal material of the hybrid metal structure is the same as the first metal material of the one of the via contact and the metal line.

In accordance with some embodiments of the present disclosure, the metal line which is connected to the via contact has a width smaller than that of the another metal line which includes the hybrid metal structure.

In accordance with some embodiments of the present disclosure, the second metal material includes one of copper, ruthenium and cobalt.

In accordance with some embodiments of the present disclosure, the semiconductor device further includes a barrier layer which is formed in the interconnect layer and which is sandwiched between the metal line and the interconnect layer.

In accordance with some embodiments of the present disclosure, the semiconductor device further includes a barrier layer which is formed in the dielectric layer and which is sandwiched between the via contact and the dielectric layer.

In accordance with some embodiments of the present disclosure, the semiconductor device further includes a conductive line which is disposed on the via contact. The conductive line is electrically connected to the metal line through the via contact. The metal line includes the first metal material and the barrier metal layer, and the conductive line includes a material identical to that of the via contact.

In accordance with some embodiments of the present disclosure, the semiconductor device further includes a conductive line which is disposed on the via contact. The conductive line is electrically connected to the metal line through the via contact. The via contact includes the first metal material and the barrier metal layer, and the conductive line includes a material different from the first metal material of the via contact.

In accordance with some embodiments of the present disclosure, a method for manufacturing a semiconductor device includes patterning an interconnect layer that is disposed over a substrate to form a recess in the interconnect layer, filling a first metal material into the recess, where the first metal material includes an alloy, performing a planarization treatment on the first metal material using a slurry that includes an oxidizing agent to form a metal oxide layer and a barrier metal layer on the first metal material in the recess, patterning, by using the metal oxide layer as an etch stop layer, a dielectric layer that is disposed over the interconnect layer, so to form at least one via opening and at least one trench in the dielectric layer, and filling a conductive metal material into the at least one via opening and the at least one trench to form at least one via contact and at least one conductive line in the dielectric layer.

In accordance with some embodiments of the present disclosure, the method further includes, prior to filling a first metal material, forming a barrier layer over the interconnect layer and in the recess.

In accordance with some embodiments of the present disclosure, the method further includes, prior to performing a planarization treatment, depositing a second metal material on the first metal material and in the recess, and performing a planarization treatment to remove excess of the second metal material over a top surface of the interconnect layer.

In accordance with some embodiments of the present disclosure, a method for manufacturing a semiconductor device includes forming a metal line in an interconnect layer that is disposed over a substrate, forming a via opening in a first dielectric layer that is disposed over the interconnect layer, so as to expose a portion of the metal line through the via opening, filling into the via opening a first metal material which includes an alloy, performing a planarization treatment on the first metal material using a slurry that includes an oxidizing agent, so as to form a metal oxide layer and a barrier metal layer on the first metal material in the via opening, patterning, by using the metal oxide layer as an etch stop layer, a second dielectric layer that is disposed over the first dielectric layer, so as to form a trench in the second dielectric layer, and filling a second metal material into the trench to form a conductive line in the second dielectric layer.

In accordance with some embodiments of the present disclosure, performing a planarization treatment on the first metal material includes performing a first chemical mechanical polishing (CMP) process using a first CMP slurry to remove excess of the first metal material over a top surface of the first dielectric layer, wherein the first CMP slurry includes an oxidizing agent which oxidizes a metal element of the alloy of the first metal material into a metal oxide, and performing a second CMP process using a second CMP slurry to buff a top surface of the semiconductor device to form the metal oxide layer and the barrier metal layer under the metal oxide layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
an interconnect layer disposed over the substrate;
a metal line formed in the interconnect layer;
a dielectric layer disposed on the interconnect layer; and
a via contact formed in the dielectric layer and electrically connected to the metal line, one of the via contact and the metal line including a first metal material and a barrier metal layer disposed on the first metal material, the first metal material including an alloy which is a mixture of two metal elements, the barrier metal layer including one of the two metal elements,
wherein the semiconductor device further includes a first metal oxide layer that is disposed between the dielectric layer and the barrier metal layer of the metal line, and that is penetrated by the via contact, and
wherein a bottom surface of the first metal oxide layer is lower than a bottom surface of the dielectric layer.

2. The semiconductor device according to claim 1, wherein the two metal elements of the alloy are a relatively active metal element having a lower reduction potential and a relatively noble metal element having a higher reduction potential, the barrier metal layer including the relatively noble metal element of the alloy.

3. The semiconductor device according to claim 2, wherein the alloy of the first metal material is presented as $A_xB_y$, where A is the relatively active metal element, B is the relatively noble metal element, x is an integer ranging from 1 to 5, and y is another integer ranging from 1 to 9.

4. The semiconductor device according to claim 2, wherein the relatively active metal element includes one of aluminum, manganese, zirconium and chromium.

5. The semiconductor device according to claim 2, wherein the relatively noble metal element includes one of copper, ruthenium and cobalt.

6. The semiconductor device according to claim 2, further comprising:
another metal line which is formed in the interconnect layer and which includes a first metal material and a barrier metal layer disposed on the first metal material, the first metal material of the another metal line being the same as the first metal material of the one of the via contact and the metal line, materials of the barrier metal layer of the another metal line and the barrier metal layer of the one of the via contact and the metal line being the same; and
a second metal oxide layer which is formed in the interconnect layer and which covers an upper surface of the another metal line.

7. The semiconductor device according to claim 1, further comprising:
another metal line which is formed in the interconnect layer and which includes a hybrid metal structure, the hybrid metal structure including a first metal material that is located at lateral and bottom regions of the hybrid metal structure and a second metal material that is located at a central region of the hybrid metal structure, the first metal material of the hybrid metal structure being the same as the first metal material of the one of the via contact and the metal line.

8. The semiconductor device according to claim 7, wherein the second metal material includes one of copper, ruthenium and cobalt.

9. The semiconductor device according to claim 1, further comprising a barrier layer which is formed in the interconnect layer and which is sandwiched between the metal line and the interconnect layer.

10. The semiconductor device according to claim 1, further comprising a barrier layer which is formed in the dielectric layer and which is sandwiched between the via contact and the dielectric layer.

11. The semiconductor device according to claim 1, further comprising a conductive line which is disposed on the via contact, the conductive line being electrically connected to the metal line through the via contact,
wherein the metal line includes the first metal material and the barrier metal layer, and the conductive line includes a material identical to a material of the via contact.

12. The semiconductor device according to claim 1, further comprising a conductive line which is disposed on the via contact, the conductive line being electrically connected to the metal line through the via contact, wherein the via contact includes the first metal material and the barrier metal layer, and the conductive line includes a material different from the first metal material of the via contact.

13. The semiconductor device according to claim 1, wherein the bottom surface of the first metal oxide layer interfaces a top surface of the barrier metal layer.

14. A semiconductor device comprising:

a substrate;

an interconnect layer disposed over the substrate;

a metal line formed in the interconnect layer;

a dielectric layer disposed on the interconnect layer; and a via contact formed in the dielectric layer and electrically connected to the metal line, one of the via contact and the metal line including a hybrid metal structure and a metal layer, wherein the hybrid metal structure includes a first metal material located at lateral and bottom regions of the hybrid metal structure, and including an alloy which is a mixture of two metal elements, and a second metal material located at a central region of the hybrid metal structure, and being different from the first metal material, wherein the metal layer is disposed on the first metal material of the hybrid metal structure of the metal line and laterally covers the second metal material, and wherein a side surface of the second metal material has a direct interface with each of the first metal material and the metal layer.

15. The semiconductor device according to claim 14, further comprising a metal oxide layer disposed on the metal layer, the metal oxide layer including one of the two metal elements, the metal layer including the other one of the two metal elements.

16. The semiconductor device according to claim 14, wherein an upper surface of the second metal material is exposed from the metal oxide layer.

17. The semiconductor device according to claim 14, further comprising an etch stop layer disposed between the interconnect layer and the dielectric layer, a bottom surface of the etch stop layer interfacing a top surface of the second metal material which is connected to the side surface of the second metal material.

18. A semiconductor device comprising:

a substrate;

an interconnect layer disposed over the substrate;

a metal line formed in the interconnect layer;

a metal-containing etch stop layer disposed on the interconnect layer;

a non-metallic etch stop layer disposed on and interfacing a top surface of the metal-containing etch stop layer;

a dielectric layer disposed on the non-metallic etch stop layer opposite to the metal-containing etch stop layer; and a via contact formed in the dielectric layer and electrically connected to the metal line, one of the via contact and the metal line including a first metal material and a barrier metal layer disposed on the first metal material and being in contact with the metal-containing etch stop layer, the first metal material including an alloy which is a mixture of two metal elements, the barrier metal layer including one of the two metal elements.

19. The semiconductor device according to claim 18, wherein the via contact penetrates the metal-containing etch stop layer and the non-metallic etch stop layer, and is in direct contact with the barrier metal layer.

20. The semiconductor device according to claim 18, wherein an entirety of the interconnect layer is located directly above the substrate.

* * * * *